US012604618B2

(12) United States Patent (10) Patent No.: US 12,604,618 B2
Kim et al. (45) Date of Patent: Apr. 14, 2026

(54) DISPLAY DEVICE

(71) Applicant: SAMSUNG DISPLAY CO., LTD.,
Yongin-si (KR)

(72) Inventors: Jong Seok Kim, Yongin-si (KR);
Chang Woo Kwon, Yongin-si (KR);
Yong Hwan Park, Yongin-si (KR);
Seong Jun Lee, Yongin-si (KR); **Won
Woo Choi**, Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 0 days.

(21) Appl. No.: 18/915,493

(22) Filed: Oct. 15, 2024

(65) Prior Publication Data

US 2025/0287791 A1 Sep. 11, 2025

(30) Foreign Application Priority Data

Mar. 7, 2024 (KR) ........................ 10-2024-0032785

(51) Int. Cl.
_H10K 59/126_ (2023.01)
_G06F 3/041_ (2006.01)
(Continued)

(52) U.S. Cl.
CPC ......... _H10K 59/126_ (2023.02); _G06F 3/0412_
(2013.01); _G06F 3/0445_ (2019.05);
(Continued)

(58) Field of Classification Search
CPC .. H10K 59/126; H10K 59/131; H10K 59/122;
H10K 59/12; H10K 59/40; H10K 59/87;
H10K 59/1213; H10K 59/873; H10K 59/124; H10K 59/1216; H10K 77/111;
G06F 3/0445; G06F 3/0446; G06F
3/0412; G06F 3/04164; G06F 3/0443;
G06F 3/044; G06F 3/047; G06F
2203/04112;
(Continued)

(56) References Cited

U.S. PATENT DOCUMENTS

2021/0217835 A1* 7/2021 Park ..................... H10K 50/844
2023/0376135 A1* 11/2023 Han .................... G06F 3/04164
2024/0373696 A1* 11/2024 Kim ..................... H10K 59/352

FOREIGN PATENT DOCUMENTS

CN 115808984 A 3/2023

* cited by examiner

*Primary Examiner* — Jimmy H Nguyen
(74) *Attorney, Agent, or Firm* — F. CHAU &
ASSOCIATES, LLC

(57) ABSTRACT

A display device including: a display panel including a main
region and a sub-region, wherein the display panel includes
a circuit layer, an element layer, an encapsulation layer, and
a touch sensor layer, the main region includes a display area
and a non-display area, the non-display area includes a dam
area in which at least one dam portion surrounding the
display area is arranged, a bonding area surrounding the dam
area, and a bank area disposed between the side of the main
region and the bonding area, and the display panel further
includes: sensing transmission lines electrically connected
to the touch sensor layer and extending to the sub-region; a
ground line adjacent to one of the sensing transmission lines;
a bank disposed in the bank area and adjacent to the ground
line; and a first static electricity shielding portion overlap-
ping the bank and electrically connected to the ground line.

20 Claims, 23 Drawing Sheets

(51) Int. Cl.
  G06F 3/044 (2006.01)
  G09G 3/3233 (2016.01)
  H10K 59/122 (2023.01)
  H10K 59/131 (2023.01)
  H10K 59/40 (2023.01)

(52) U.S. Cl.
  CPC ......... *G06F 3/0446* (2019.05); *G09G 3/3233* (2013.01); *H10K 59/122* (2023.02); *H10K 59/131* (2023.02); *G06F 2203/04102* (2013.01); *G06F 2203/04107* (2013.01); *G06F 2203/04111* (2013.01); *G09G 2300/0819* (2013.01); *G09G 2300/0852* (2013.01); *G09G 2300/0861* (2013.01); *G09G 2330/04* (2013.01); *G09G 2354/00* (2013.01); *H10K 59/40* (2023.02)

(58) Field of Classification Search
  CPC ......... G09G 3/3233; G09G 2300/0819; G09G 2300/0852; G09G 2300/0861; G09G 2330/04; G09G 2354/00; G09F 9/301; H05K 9/0067
  USPC .................................................. 345/174, 76
  See application file for complete search history.

FIG. 11

TCDL1: STR1, GNL1, ESIIL1
TCDL2: STR2, GNL2, ESIIL3

DISPLAY DEVICE

CROSS-REFERENCE TO RELATED APPLICATION

This application claims priority under 35 U.S.C. § 119 to Korean Patent Application No. 10-2024-0032785 filed on Mar. 7, 2024 in the Korean Intellectual Property Office, the disclosure of which is incorporated by reference herein in its entirety.

1. Technical Field

The present disclosure relates to a display device.

2. Description of the Related Art

With the advance of an information-oriented society, the demand for display devices capable of presenting images in diverse ways has significantly increased. For example, display devices are now integral to various electronic products such as smartphones, digital cameras, laptop computers, navigation systems, and smart televisions.

The display device may be a flat panel type, such as a liquid crystal display device, a field emission display device, or a light emitting display device. Examples of the light emitting display device may include an organic light emitting display device including organic light emitting elements, an inorganic light emitting display device including inorganic light emitting elements such as inorganic semiconductors, and a micro light emitting display device including micro light emitting elements.

The organic light emitting display device generates an image using light emitting elements, each including a light emitting layer made of an organic light emitting material. This self-emissive technology enables the organic light emitting display device to outperform other display technologies in areas such as power consumption, response speed, luminous efficiency, luminance, and viewing angle.

The display device may have a display area on one surface where images are shown, and a non-display area surrounding the display area. Within the display area, emission regions may be arranged, emitting light at various luminances and colors.

SUMMARY

The substrate of the display device may include a main region including a display area and a non-display area, and a sub-region protruding from one side of the main region.

Signal pads, to which a circuit board is bonded, may be disposed in the sub-region of the substrate. Alternatively, a display driving circuit that supplies a data signal may be mounted in the sub-region. Accordingly, the display device may include wires disposed in the non-display area of the main region and extending to the sub-region.

The display device may further include a shielding layer covering a bank disposed adjacent to one edge of the main region.

Because the shielding layer is adjacent to one edge of the main region and designed as an island-shaped conductive layer, any static electricity introduced from the edge of the main region may be concentrated at the shielding layer.

However, the wires extending to the sub-region are arranged along the boundary between the main region and the sub-region, making them vulnerable to damage from static electricity introduced from the edge of the main region or concentrated at the shielding layer. This can negatively impact the display quality and lifespan of the display device.

Embodiments of the present disclosure provide a display device that can reduce wire damage caused by static electricity introduced from the edge of the main region.

According to an embodiment of the present disclosure, there is provided a display device including: a display panel including a main region and a sub-region protruding from a side of the main region, wherein the display panel include a circuit layer disposed on a substrate, an element layer disposed on the circuit layer, an encapsulation layer disposed on the element layer, and a touch sensor layer disposed on the encapsulation layer, the main region includes a display area in which emission areas are arranged, and a non-display area disposed adjacent to the display area, the non-display area includes a dam area in which at least one dam portion surrounding the display area is arranged, a bonding area surrounding the dam area, and a bank area disposed between the side of the main region and the bonding area, and the display panel further includes: sensing transmission lines electrically connected to the touch sensor layer and extending to the sub-region; a ground line adjacent to one of the sensing transmission lines; a bank disposed in the bank area and adjacent to the ground line; and a first static electricity shielding portion overlapping the bank and electrically connected to the ground line.

The touch sensor layer includes: a touch buffer layer overlapping the encapsulation layer; a first touch conductive layer disposed on the touch buffer layer; a touch interlayer insulating layer overlapping the first touch conductive layer; a second touch conductive layer disposed on the touch interlayer insulating layer; and a touch planarization layer overlapping the second touch conductive layer, the ground line includes: a first ground layer disposed in the first touch conductive layer; and a second ground layer disposed in the second touch conductive layer and electrically connected to the first ground layer through a hole penetrating the touch interlayer insulating layer, and the first static electricity shielding portion is disposed in the first touch conductive layer, and includes a main shielding portion overlapping the bank, and a ground connecting portion extending from the main shielding portion to the first ground layer and in contact with the first ground layer.

The element layer includes light emitting elements disposed in the emission areas, the circuit layer includes: light emitting pixel drivers electrically connected to the light emitting elements; data lines configured to transmit a data signal to the light emitting pixel drivers; and data supply lines respectively electrically connected to the data lines, disposed in the non-display area, and extending to the sub-region, the data supply lines overlap a part of the bank, and the sensing transmission lines are arranged in a portion of the bank area adjacent to a side of the sub-region, intersect the data lines, and are spaced apart from the bank.

The circuit layer includes: a semiconductor layer disposed on the substrate; a first gate insulating layer overlapping the semiconductor layer; a first gate conductive layer disposed on the first gate insulating layer; a second gate insulating layer overlapping the first gate conductive layer; a second gate conductive layer disposed on the second gate insulating layer; an interlayer insulating layer overlapping the second gate conductive layer; a first planarization layer disposed on the interlayer insulating layer; and a second planarization layer disposed on the first planarization layer, wherein the data supply lines are disposed in the first gate conductive layer or the second gate conductive layer.

The element layer includes: anode electrodes respectively disposed in the emission areas; a pixel defining layer disposed in a non-emission area disposed between the emission areas and overlapping an edge of each of the anode electrodes; a spacer layer disposed on a portion of the pixel defining layer; light emitting layers respectively disposed on the anode electrodes; and a cathode electrode disposed on the pixel defining layer, the spacer layer, and the light emitting layers, wherein the bank includes: a first bank layer disposed in the same layer as the first planarization layer; a second bank layer disposed in the same layer as the second planarization layer; a third bank layer disposed in the same layer as the pixel defining layer; and a fourth bank layer disposed in the same layer as the spacer layer, and the first bank layer and the second bank layer extend to the sub-region.

Each of the sensing transmission lines includes: a first sensing transmission layer disposed in the first touch conductive layer; and a second sensing transmission layer disposed in the second touch conductive layer and electrically connected to the first sensing transmission layer through a hole penetrating the touch interlayer insulating layer.

The display panel further includes a second static electricity shielding portion disposed in the bank area and overlapping the data supply lines, and the second static electricity shielding portion is disposed in the second touch conductive layer.

The second static electricity shielding portion is electrically connected to the first static electricity shielding portion through a hole penetrating the touch interlayer insulating layer.

The display panel further includes a third static electricity shielding portion disposed in the bank area and overlapping the sensing transmission lines, a portion of each of the sensing transmission lines intersecting the bank area is composed solely of the first sensing transmission layer, and the third static electricity shielding portion is disposed in the second touch conductive layer.

The third static electricity shielding portion is in contact with the second ground layer, and is electrically connected to the ground line and the first static electricity shielding portion.

The at least one dam portion includes two or more dam layers, each of the two or more dam layers is disposed in the same layer as one of the first planarization layer, the second planarization layer, the pixel defining layer, and the spacer layer, the bank has a thickness greater than or equal to that of the at least one dam portion, the encapsulation layer includes: a first encapsulation layer overlapping the cathode electrode and containing an inorganic insulating material; a second encapsulation layer disposed on the first encapsulation layer and containing an organic insulating material; and a third encapsulation layer overlapping the second encapsulation layer and containing the inorganic insulating material, the second encapsulation layer is disposed in an area surrounded by the at least one dam portion, the first encapsulation layer is in contact with the interlayer insulating layer in the bonding area, the third encapsulation layer is in contact with the first encapsulation layer or the interlayer insulating layer in the bonding area, the bank is spaced apart from the encapsulation layer, and the touch buffer layer includes the inorganic insulating material and is in contact with the interlayer insulating layer in a separation region between the bank and the encapsulation layer in the bonding area.

The sub-region includes a bending area which transitions into a bent shape, a first sub-region disposed between the side of the main region and a first side of the bending area, and a second sub-region extending from a second side of the bending area, the display panel further includes: a bending hole disposed in the bending area and penetrating the buffer layer, the first gate insulating layer, the second gate insulating layer, and the interlayer insulating layer; data bending lines disposed in the bending area and respectively electrically connected to the data supply lines; and sensing bending lines disposed in the bending area and respectively electrically connected to the sensing transmission lines, and each of the data bending lines and the sensing bending lines is disposed on the first bank layer.

The display device further includes: a cover window facing the main region of the display panel; an adhesive layer configured to fix the cover window on the display panel; and a bending cover layer spaced apart from the adhesive layer and overlapping the bending area, wherein the main region includes: at least one folding area which is bent or unfolded with respect to a folding axis extending in one direction; and a plurality of non-folding areas disposed on both sides of the at least one folding area, and a separation region between the adhesive layer and the bending cover layer overlaps the bank area.

According to an embodiment of the present disclosure, there is provided a display device including: a display panel including a main region and a sub-region protruding from a side of the main region, wherein the display panel includes a circuit layer disposed on a substrate, an element layer disposed on the circuit layer, an encapsulation layer disposed on the element layer, and a touch sensor layer disposed on the encapsulation layer, the main region includes a display area in which emission areas are arranged, and a non-display area adjacent to the display area, the non-display area includes a dam area in which at least one dam portion surrounding the display area is arranged, a bonding area surrounding the dam area, and a bank area disposed between the side of the main region and the bonding area, and the display panel further includes: sensing transmission lines electrically connected to the touch sensor layer and extending to the sub-region; a ground line adjacent to one of the sensing transmission lines; a bank disposed in the bank area, having a thickness greater than that of the at least one dam portion, and adjacent to the ground line; and a first static electricity shielding portion overlapping the bank and electrically connected to the ground line, and the first static electricity shielding portion includes a main shielding portion overlapping the bank, and a ground connecting portion disposed between the main shielding portion and the ground line.

The touch sensor layer includes: a touch buffer layer overlapping the encapsulation layer; a first touch conductive layer disposed on the touch buffer layer; a touch interlayer insulating layer overlapping the first touch conductive layer; a second touch conductive layer disposed on the touch interlayer insulating layer; and a touch planarization layer overlapping the second touch conductive layer, each of the sensing transmission lines includes: a first sensing transmission layer disposed in the first touch conductive layer; and a second sensing transmission layer disposed in the second touch conductive layer and electrically connected to the first sensing transmission layer through a hole penetrating the touch interlayer insulating layer, the ground line includes: a first ground layer disposed in the first touch conductive layer; and a second ground layer disposed in the second touch conductive layer and electrically connected to the first ground layer through a hole penetrating the touch interlayer insulating layer, the first static electricity shielding portion is disposed in the first touch conductive layer, and the ground connecting portion of the first static electricity shielding portion is in contact with the first ground layer.

The element layer includes light emitting elements disposed in the emission areas, the circuit layer includes: light emitting pixel drivers electrically connected to the light emitting elements; data lines configured to transmit a data signal to the light emitting pixel drivers; and data supply lines respectively electrically connected to the data lines, disposed in the non-display area, and extending to the sub-region, the data supply lines overlap a part of the bank, and the sensing transmission lines are arranged in a part of the bank area adjacent to one side of the sub-region, intersect the data lines, and are spaced apart from the bank.

The display panel further includes a second static electricity shielding portion disposed in the bank area and overlapping the data supply lines, the second static electricity shielding portion is disposed in the second touch conductive layer, and the second static electricity shielding portion is electrically connected to the ground line and the first static electricity shielding portion through a hole penetrating the touch interlayer insulating layer.

The display panel further includes a third static electricity shielding portion disposed in the bank area and overlapping the sensing transmission lines, a portion of each of the sensing transmission lines intersecting the bank area is composed solely of the first sensing transmission layer, and the third static electricity shielding portion is disposed in the second touch conductive layer and is electrically connected to the ground line and the first static electricity shielding portion.

The circuit layer includes: a semiconductor layer disposed on the substrate; a first gate insulating layer overlapping the semiconductor layer; a first gate conductive layer disposed on the first gate insulating layer; a second gate insulating layer overlapping the first gate conductive layer; a second gate conductive layer disposed on the second gate insulating layer; an interlayer insulating layer overlapping the second gate conductive layer; a first planarization layer disposed on the interlayer insulating layer; and a second planarization layer disposed on the first planarization layer, the element layer includes: anode electrodes respectively disposed in the emission areas; a pixel defining layer disposed in a non-emission area disposed between the emission areas and overlapping an edge of each of the anode electrodes; a spacer layer disposed on a portion of the pixel defining layer; light emitting layers respectively disposed on the anode electrodes; and a cathode electrode disposed on the pixel defining layer, the spacer layer, and the light emitting layers, the encapsulation layer includes: a first encapsulation layer overlapping the cathode electrode and containing an inorganic insulating material; a second encapsulation layer disposed on the first encapsulation layer and containing an organic insulating material; and a third encapsulation layer overlapping the second encapsulation layer and containing the inorganic insulating material, the bank includes: a first bank layer disposed in the same layer as the first planarization layer; a second bank layer disposed in the same layer as the second planarization layer; a third bank layer disposed in the same layer as the pixel defining layer; and a fourth bank layer disposed in the same layer as the spacer layer, and the first bank layer and the second bank layer extend to the sub-region, the data supply lines are disposed in the first gate conductive layer or the second gate conductive layer, the second encapsulation layer is disposed in an area surrounded by the at least one dam portion, the first encapsulation layer is in contact with the interlayer insulating layer in the bonding area, the third encapsulation layer is in contact with the first encapsulation layer or the interlayer insulating layer in the bonding area, the bank is spaced apart from the encapsulation layer, and the touch buffer layer includes the inorganic insulating material and is in contact with the interlayer insulating layer in a separation region between the bank and the encapsulation layer in the bonding area.

The sub-region includes a bending area which transitions into a bent shape, a first sub-region disposed between the side of the main region and a first side of the bending area, and a second sub-region extending from a second side of the bending area, the main region includes: at least one folding area which is bent or unfolded with respect to a folding axis extending in one direction; and a plurality of non-folding areas disposed on both sides of the at least one folding area, the display device further including: a cover window facing the main region of the display panel; an adhesive layer configured to fix the cover window on the display panel; and a bending cover layer spaced apart from the adhesive layer and overlapping the bending area, wherein a separation region between the adhesive layer and the bending cover layer overlaps the bank area.

In accordance with embodiments of the present disclosure, the first static electricity shielding portion is electrically connected to the ground line. This allows static electricity concentrated at the first static electricity shielding portion to be quickly and efficiently discharged through the ground line, thereby reducing the likelihood of wire damage in the bank area due to static electricity.

As a result, the display quality and lifespan of the display device may be improved.

BRIEF DESCRIPTION OF THE DRAWINGS

The above and other features of the present disclosure will become more apparent by describing in detail embodiments thereof with reference to the attached drawings, in which:

FIG. 11 is a cross-sectional view taken along line F-F' of FIG. 10;

DETAILED DESCRIPTION OF THE EMBODIMENTS

Figure 1:
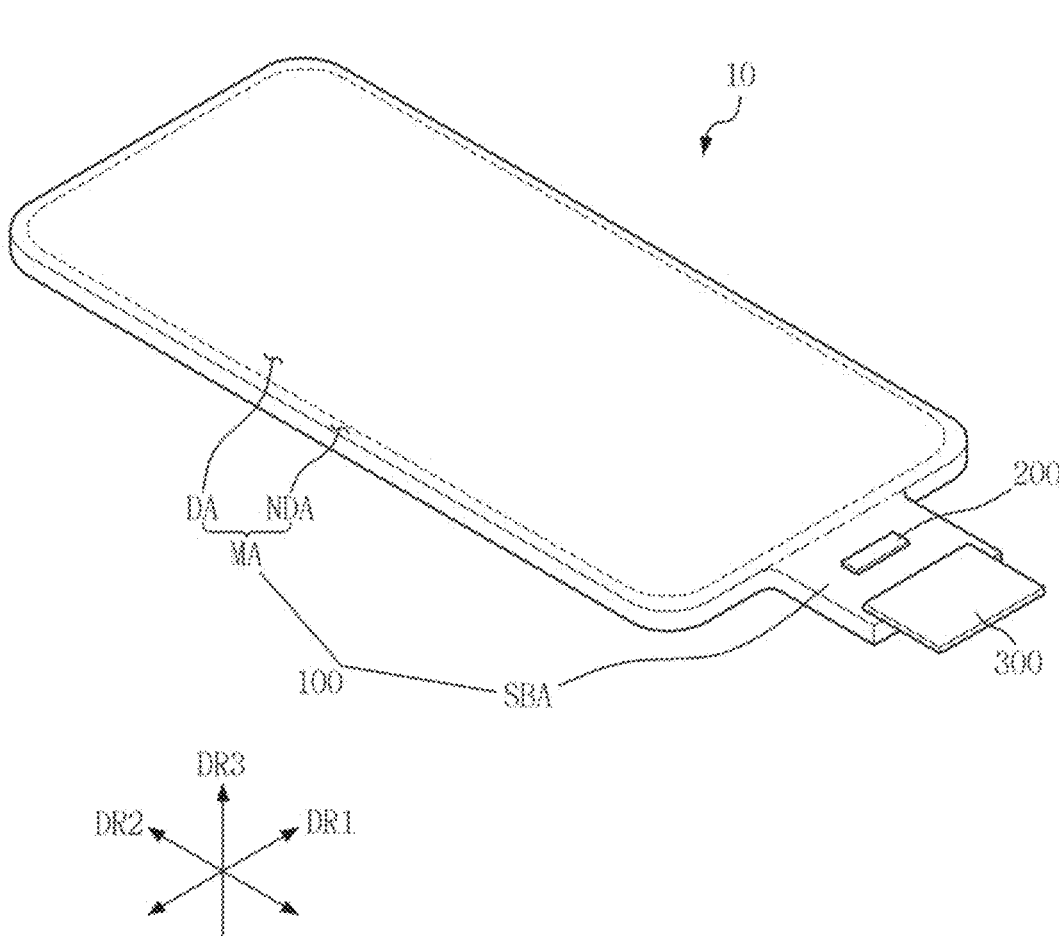
FIG. 1 is a perspective view illustrating a display device according to embodiments.

The embodiments will now be described in greater detail with reference to the accompanying drawings. However, these embodiments may take various forms and should not be construed as limiting. The same reference numbers are used to denote the same components throughout the disclosure. In the accompanying figures, the thickness of layers and regions may be exaggerated for clarity.

Some components that are not relevant to the description may be omitted to better focus on the embodiments of the disclosure.

It will also be understood that when a layer is referred to as being "on" another layer or substrate, it can be directly on the other layer or substrate, or intervening layers may also be present.

In contrast, when an element is referred to as being "directly on" another element, there may be no intervening elements present.

Further, the phrase "in a plan view" refers to viewing an object portion from above, while "in a schematic cross-sectional view" refers to viewing a schematic cross-section taken of an object portion that has been vertically cur, from the side. The terms "overlap" or "overlapped" indicate that a first object may be above, below or to a side of a second object, and vice versa. Additionally, the term "overlap" may encompass various meanings such as layer, stack, face or facing, extending over, covering, or partly covering or any other suitable term understood by those of ordinary skill in the art. The expression "not overlap" may imply meanings such as "apart from," "set aside from," "offset from" or other suitable equivalents as recognized by those of ordinary skill in the art. The terms "face" and "facing" indicate that a first object may directly or indirectly oppose a second object. If a third object intervenes between a first and second object, the first and second objects may still be considered as indirectly opposed or facing each other.

Spatially relative terms such as "below," "beneath," "lower," "above," "upper," or the like, are used herein for convenience to describe the relationship between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientation.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element. For example, when "a first element" is discussed in the description, it may be termed "a second element" or "a third element," and "a second element" and "a third element" may be termed in a similar manner.

The terms "about" or "approximately," as used herein, are inclusive of the stated value and refer to an acceptable range of deviation as determined by one of ordinary skill in the art. This range takes into account the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or". For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of". For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an idealized or overly formal sense unless explicitly defined in the specification.

Figure 2:
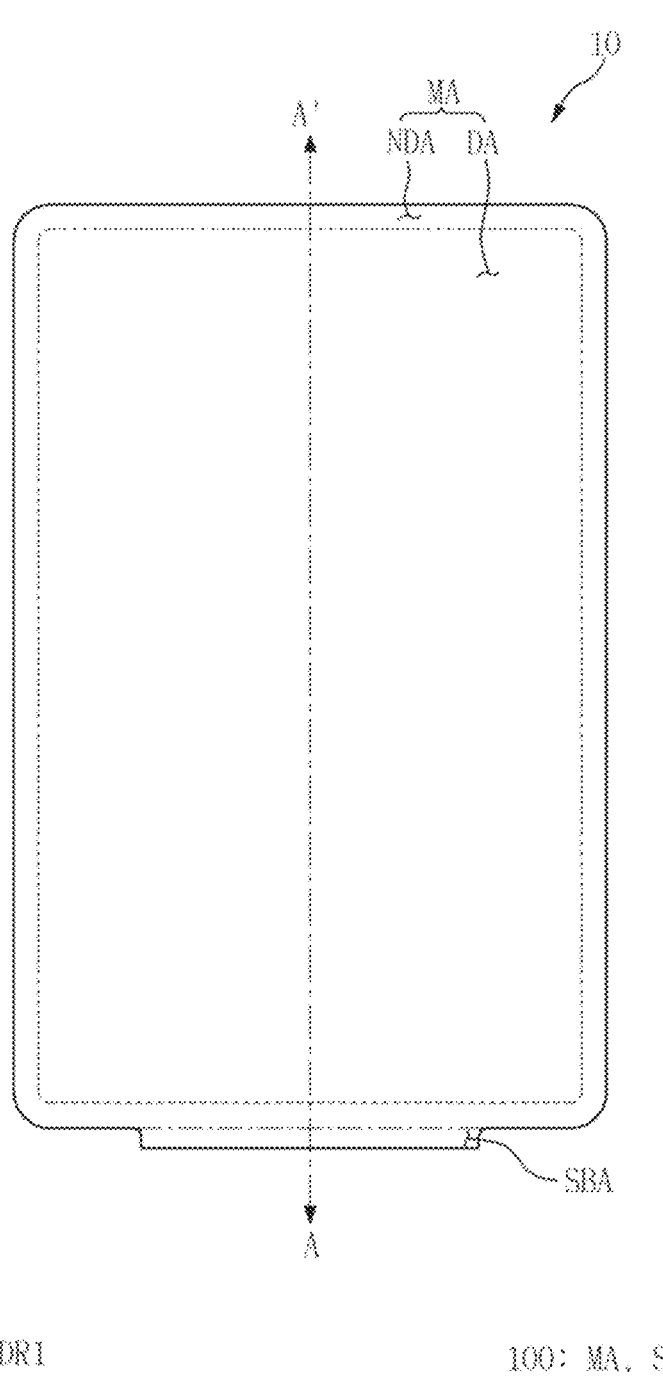
FIG. 2 is a plan view illustrating the display device of FIG. 1.
Figure 3:
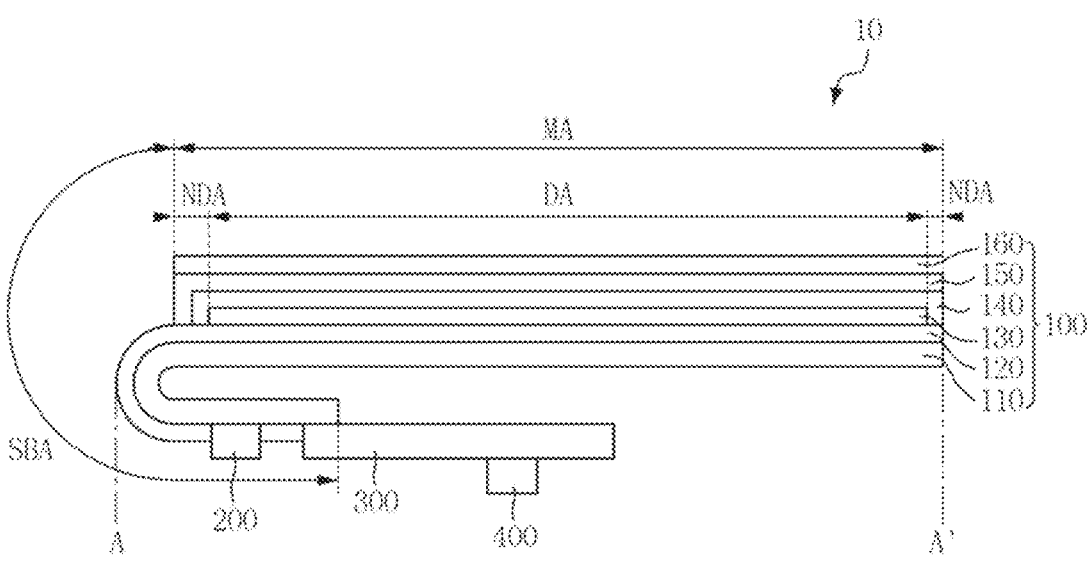
FIG. 3 is a cross-sectional view taken along line A-A' of FIG. 2.
Figure 3:
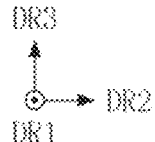

FIG. 1 is a perspective view illustrating a display device according to embodiments. FIG. 2 is a plan view illustrating the display device of FIG. 1. FIG. 3 is a cross-sectional view taken along line A-A' of FIG. 2.

Referring to FIGS. 1 and 2, a display device 10, which is a device for displaying a moving image or a still image, may be used as a display screen of various devices, such as a television, a laptop computer, a monitor, a billboard and an Internet-of-Things (IOT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation system and an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 10 is an organic light emitting display device. However, the present disclosure is not limited thereto, and may be applied to a display device including an organic insulating material, an organic light emitting material, and a metal material.

The display device 10 may be flat, but is not limited thereto. For example, the display device 10 may include curved portions at the left and right ends, which may have either a constant or varying curvature. Additionally, the display device 10 may be designed to be flexible, allowing it to be curved, bent, folded, or rolled.

As shown in FIGS. 1, 2, and 3, the display device 10 according to embodiments includes a display panel 100 that emits light from at least one surface.

The display panel 100 includes a main region MA and a sub-region SBA that protrudes from one side of the main region MA.

As shown in FIG. 2, the main region MA may include a display area DA disposed predominantly at the center, and a non-display area NDA disposed around the display area DA.

In a plan view, the display area DA may have a rectangular shape with short sides in a first direction DR1 and long sides in a second direction DR2 crossing the first direction DR1. The corner where the short side in the first direction DR1 and the long side in the second direction DR2 meet may be rounded to have a predetermined curvature or may be right-angled. The planar shape of the display area DA is not limited to the rectangular shape; it can also be formed in other polygonal shapes, or as a circular shape or elliptical shape.

The non-display area NDA may be disposed at the edge of the main region MA to surround the display area DA.

The sub-region SBA may extend in the second direction DR2 from a part of one side of the main region MA, which extends in the first direction DR1.

The sub-region SBA may include a bending area BA (see FIG. 3) that is capable of being transformed into a bent shape.

FIGS. 2 and 3 illustrate the display device 10 in a state where the bending area BA (see FIG. 3) of the sub-region SBA is transformed into a bent shape.

Figure 4:
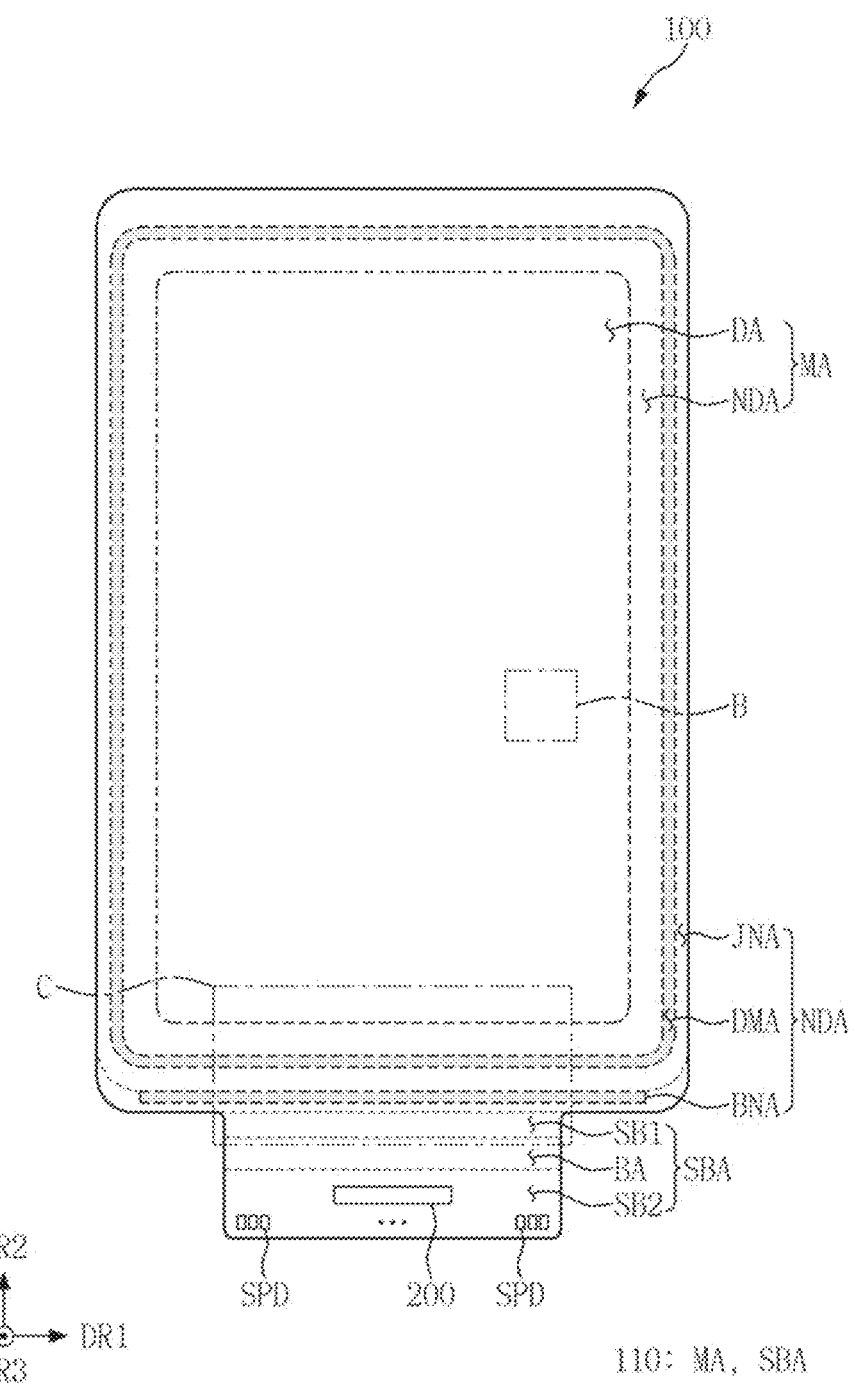
FIG. 4 is a plan view showing the substrate of FIG. 3.

As shown in FIGS. 3 and 4 (see also FIG. 23), the sub-region SBA may include the bending area BA that is transformed into a bent shape, a first sub-region SB1 disposed between one side of the main region MA and one side of the bending area BA, and a second sub-region SB2 extending from the other side of the bending area BA.

When the bending area BA is transformed into a bent shape, the second sub-region SB2 may be disposed on the rear surface of the display panel 100 and may overlap the main region MA.

A display driving circuit 200 provided as an integrated circuit (IC) chip may be mounted in the second sub-region SB2.

A circuit board 300 may be bonded to one side of the second sub-region SB2.

A touch driving circuit 400 provided as an integrated circuit (IC) chip may be mounted on the circuit board 300.

Referring to FIG. 3, the display panel 100 of the display device 10 according to embodiments may include a substrate 110, a circuit layer 120 disposed on the substrate 110, an element layer 130 disposed on the circuit layer 120, an encapsulation layer 140 disposed on the element layer 130, and a touch sensor layer 150 disposed on the encapsulation layer 140.

The display panel 100 of the display device 10 according to embodiments may further include a polarization layer 160 disposed on the touch sensor layer 150 to reduce the reflection of external light.

The substrate 110 may be formed of an insulating material such as a polymer resin. For example, the substrate 110 may be formed of polyimide. The substrate 110 may be a flexible substrate which can be bent, folded or rolled.

Alternatively, the substrate 110 may be formed of an insulating material such as glass or the like.

The substrate 110 may include the main region MA and the sub-region SBA.

FIG. 4 is a plan view showing the substrate of FIG. 3.

Referring to FIG. 4, the display panel 100 of the display device 10 according to embodiments may include the substrate 110, and the substrate 110 may include the main region MA corresponding to a display surface, and the sub-region SBA extending from one side of the main region MA.

The main region MA may include the display area DA located predominantly at the center, and the non-display area NDA positioned at the periphery, surrounding the display area DA.

The non-display area NDA may include a dam area DMA, in which at least one dam portion DM (see FIG. 10) surrounding the display area DA is arranged, a bonding area JNA encircling the dam area DMA, and a bank area BNA positioned between one side of the main region MA and the bonding area JNA.

The dam area DMA may be spaced apart from the display area DA.

The sub-region SBA may include the bending area BA that is transformed into a bent shape, the first sub-region SB1 disposed between a first side of the bending area BA and the main region MA, and the second sub-region SB2 connected to a second side of the bending area BA.

When the bending area BA is transformed into a bent shape, the second sub-region SB2 may be disposed below the substrate 110 and overlap the main region MA.

The display driving circuit 200 may be mounted in the second sub-region SB2. For example, the display driving circuit 200 may be mounted at the central portion of the second sub-region SB2.

In the second sub-region SB2, signal pads SPD to which the circuit board 300 is bonded may be disposed.

Figure 5:
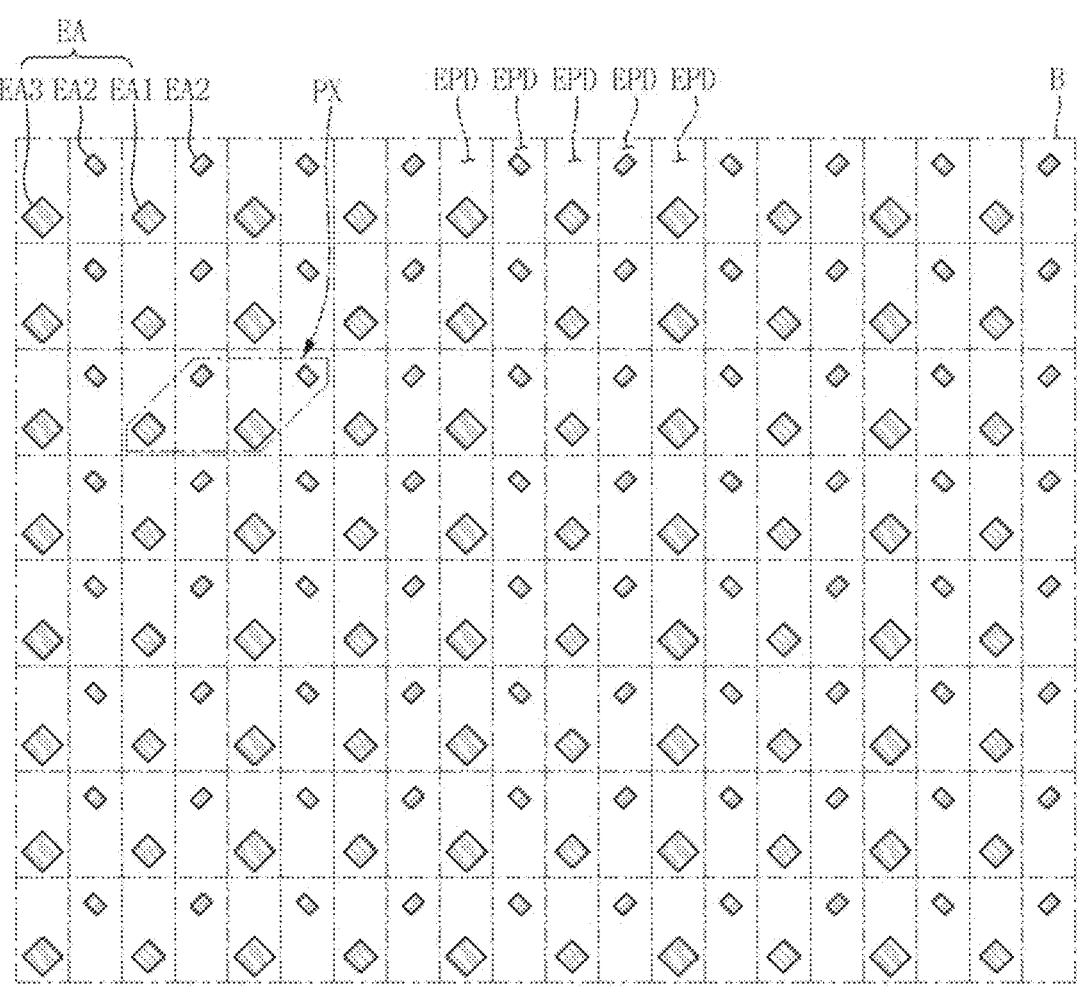
FIG. 5 is a layout diagram illustrating part B of FIG. 4.
Figure 5:

FIG. 5 is a layout diagram illustrating part B of FIG. 4.

Referring to FIG. 5, emission areas EA may be arranged in the display area DA (see FIG. 4) of the main region MA (see FIG. 4) of the display panel 100 of the display device 10 according to embodiments.

In addition, the display area DA may include a non-emission area disposed in a gap between the emission areas EA.

The element layer 130 (see FIG. 3) may include light emitting elements LE (see FIGS. 6 and 9) respectively disposed in the emission areas EA.

The circuit layer 120 (see FIG. 3) may include light emitting pixel drivers EPD respectively electrically connected to the light emitting elements of the element layer 130 (see FIG. 3).

The light emitting pixel drivers EPD may be arranged side by side in the first direction DR1 and the second direction DR2 in the display area DA.

The emission areas EA may have a rhombus shape or a rectangular shape in a plan view. However, this is only an example, and the planar shape of the emission areas EA according to an embodiment is not limited to that illustrated in FIG. 5. In other words, in a plan view, the emission areas EA may have a polygonal shape such as a square, a pentagon, a hexagon, etc., or may have a circular or elliptical shape including the edge of a curve.

The emission areas EA may include first emission areas EA1 that emit light of a first color in a predetermined wavelength band, second emission areas EA2 that emit light of a second color in a wavelength band lower than that of the first color, and third emission areas EA3 that emit light of a third color in a wavelength band lower than that of the second color.

For example, the first color may be red having a wavelength band of approximately 600 nm to 750 nm. The second color may be green having a wavelength band of approximately 480 nm to 560 nm. The third color may be blue having a wavelength band of approximately 370 nm to 460 nm.

The first emission areas EA1 and the third emission areas EA3 may be alternately arranged in at least one of the first direction DR1 or the second direction DR2.

The second emission areas EA2 may be arranged side by side with each other in at least one of the first direction DR1 or the second direction DR2.

In addition, the second emission areas EA2 may be adjacent to the first emission areas EA1 and the third emission areas EA3 in diagonal directions DR4 and DR5 intersecting the first direction DR1 and the second direction DR2.

Pixels PX, which display their own luminances and colors, may be provided by the first emission area EA1, the second emission area EA2, and the third emission area EA3 adjacent to each other among the emission areas EA.

In other words, the pixels PX may serve as a basic unit for displaying various colors including white with a predetermined luminance.

Each of the pixels PX may include at least one first emission area EA1, at least one second emission area EA2, and at least one third emission area EA3 that are adjacent to each other. Accordingly, each of the pixels PX may display various colors by combining the light emitted from the first emission area EA1, the second emission area EA2, and the third emission area EA3 that are adjacent to each other.

Figure 6:
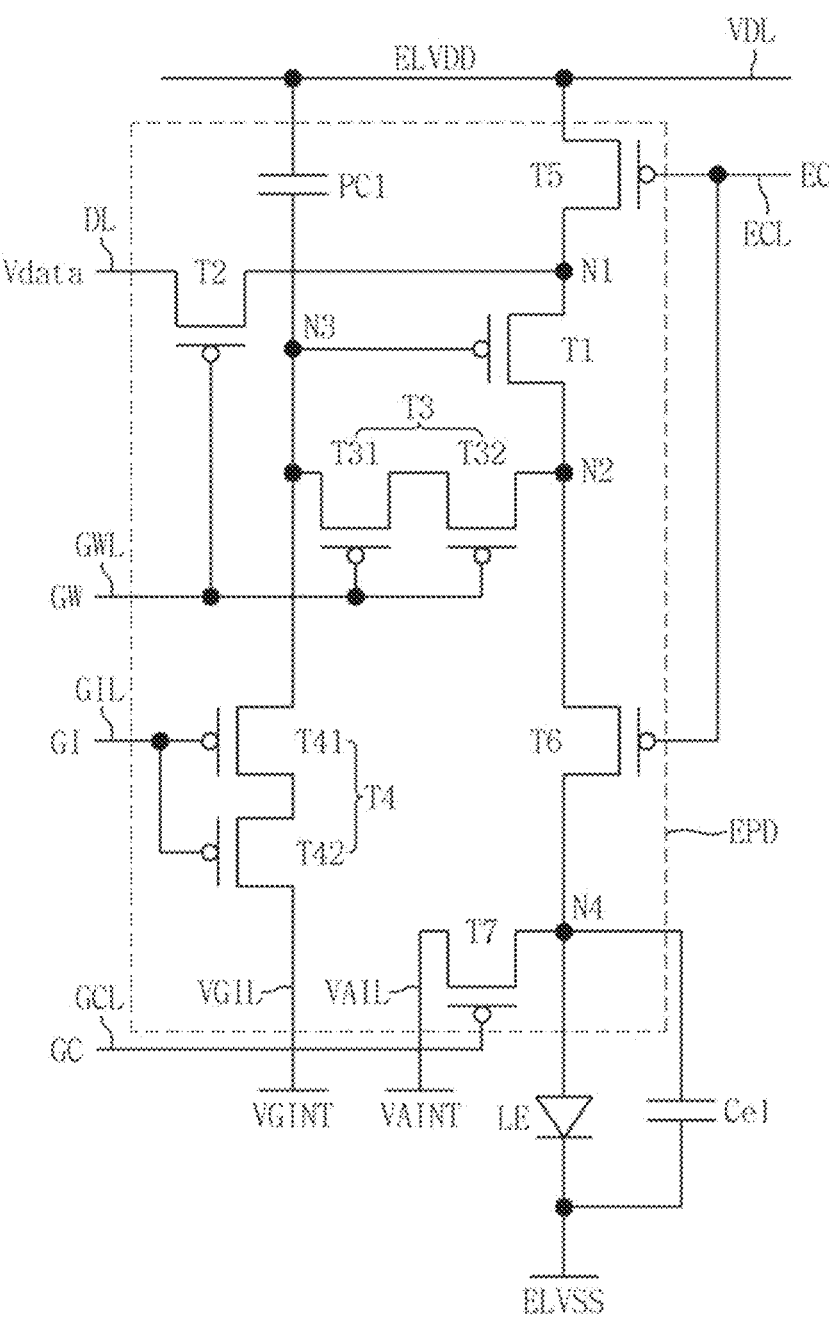
FIG. 6 is an equivalent circuit diagram showing the light emitting pixel driver of FIG. 5.

FIG. 6 is an equivalent circuit diagram showing the light emitting pixel driver of FIG. 5.

Referring to FIG. 6, one of the light emitting elements LE of the element layer 130 (see FIG. 3) may be electrically connected between one of the light emitting pixel drivers EPD of the circuit layer 120 (see FIG. 3) and a second power ELVSS.

In other words, the anode electrode of the light emitting element LE is electrically connected to the light emitting pixel driver EPD, and the cathode electrode of the light emitting element LE may be applied with the second power ELVSS that is lower than a first power ELVDD.

A capacitor Cel connected in parallel with the light emitting element LE refers to a parasitic capacitance between the anode electrode and the cathode electrode of the light emitting element LE.

The circuit layer 120 (see FIG. 3) may include a first power line VDL for transmitting the first power ELVDD, a gate initialization voltage line VGIL for transmitting a gate initialization voltage VGINT, and an anode initialization voltage line VAIL for transmitting an anode initialization voltage VAINT.

The circuit layer 120 (see FIG. 3) may further include a scan write line GWL for transmitting a scan write signal GW, a scan initialization line GIL for transmitting a scan initialization signal GI, an emission control line ECL for transmitting an emission control signal EC, and a gate control line GCL for transmitting a gate control signal GC.

One of the light emitting pixel drivers EPD of the circuit layer 120 (see FIG. 3) may include a first transistor T1 configured to generate a driving current for driving the light emitting element LE, two or more transistors T2 to T7 electrically connected to the first transistor T1, and at least one pixel capacitor PC1.

The first transistor T1 may be electrically connected between a first node N1 and a second node N2. The first node N1 is electrically connected to the first electrode (e.g., source electrode) of the first transistor T1. The second node N2 is electrically connected to the second electrode (e.g., drain electrode) of the first transistor T1.

The first node N1 may be electrically connected to the first power line VDL through the fifth transistor T5.

The second node N2 may be electrically connected to the anode electrode of the light emitting element LE through the sixth transistor T6.

The pixel capacitor PC1 may be electrically connected between the first power line VDL and a third node N3. The third node N3 is electrically connected to the gate electrode of the first transistor T1.

In other words, the gate electrode of the first transistor T1 may be electrically connected to the first power line VDL through the pixel capacitor PC1.

Accordingly, the potential of the gate electrode of the first transistor T1 may be maintained at the voltage stored in the pixel capacitor PC1.

The second transistor T2 may be electrically connected between the data line DL and the first node N1.

The second transistor T2 may be electrically connected between the first electrode of the first transistor T1 and the data line DL.

In other words, the first electrode of the first transistor T1 may be electrically connected to the data line DL through the second transistor T2.

The second transistor T2 may be turned on by the scan write signal GW of the scan write line GWL.

The fifth transistor T5 may be electrically connected between the first node N1 and the first power line VDL.

The sixth transistor T6 may be electrically connected between the second node N2 and a fourth node N4. The fourth node N4 is electrically connected to the anode electrode of the light emitting element LE.

In other words, the fifth transistor T5 may be electrically connected between the first electrode of the first transistor T1 and the first power line VDL.

The sixth transistor T6 may be electrically connected between the second electrode of the first transistor T1 and the anode electrode of the light emitting element LE.

The fifth transistor T5 and the sixth transistor T6 may be turned on by the emission control signal EC of the emission control line ECL.

When a data signal Vdata of the data line DL is transmitted to the first electrode of the first transistor T1 through the turned-on second transistor T2, the voltage difference between the gate electrode of the first transistor T1 and the first electrode of the first transistor T1 may correspond to the difference between the first power ELVDD and the data signal Vdata.

In this case, when the voltage difference between the gate electrode of the first transistor T1 and the first electrode of the first transistor T1 (e.g., the gate-source voltage difference) reaches or exceeds a threshold voltage, the first transistor T1 may be turned on, generating a drain-source current corresponding to the data signal Vdata.

Subsequently, when the fifth transistor T5 and the sixth transistor T6 are turned on, the first power ELVDD, the first transistor T1, the light emitting element LE, and the second power ELVSS may be connected in series. Accordingly, the drain-source current of the first transistor T1, corresponding to the data signal Vdata, may be supplied as a driving current for the light emitting element LE.

Consequently, the light emitting element LE may emit light with a luminance corresponding to the data signal Vdata.

The third transistor T3 may be electrically connected between the second node N2 and the third node N3. In other words, the third transistor T3 may be electrically connected between the gate electrode of the first transistor T1 and the second electrode of the first transistor T1.

The third transistor T3 may include a plurality of sub-transistors connected in series. For example, the third transistor T3 may include a first sub-transistor T31 and a second sub-transistor T32.

The first electrode of the first sub-transistor T31 may be connected to the gate electrode of the first transistor T1, the second electrode of the first sub-transistor T31 may be connected to the first electrode of the second sub-transistor T32, and the second electrode of the second sub-transistor T32 may be connected to the second electrode of the first transistor T1.

In this way, it is possible to prevent the potential of the gate electrode of the first transistor T1 from changing due to the leakage current from the third transistor T3 when it is not turned on.

The first sub-transistor T31 and the second sub-transistor T32 may be turned on by the scan write signal GW of the scan write line GWL.

When the first sub-transistor T31 and the second sub-transistor T32 are turned on, the voltage difference between the second node N2 and the third node N3 may be initialized.

The fourth transistor T4 may be electrically connected between the gate initialization voltage line VGIL and the third node N3. In other words, the fourth transistor T4 may be connected between the gate electrode of the first transistor T1 and the gate initialization voltage line VGIL.

The fourth transistor T4 may include a plurality of sub-transistors connected in series. For example, the fourth transistor T4 may include a third sub-transistor T41 and a fourth sub-transistor T42.

The first electrode of the third sub-transistor T41 may be connected to the gate electrode of the first transistor T1, the second electrode of the third sub-transistor T41 may be connected to the first electrode of the fourth sub-transistor T42, and the second electrode of the fourth sub-transistor T42 may be connected to the gate initialization voltage line VGIL.

In this way, it is possible to prevent the potential of the gate electrode of the first transistor T1 from changing due to the leakage current from the fourth transistor T4 when it is not turned on.

The third sub-transistor T41 and the fourth sub-transistor T42 may be turned on by the scan initialization signal GI of the scan initialization line GIL.

When the third sub-transistor T41 and the fourth sub-transistor T42 are turned on, the potential of the third node N3 may be initialized to the gate initialization voltage VGINT.

The seventh transistor T7 may be electrically connected between the fourth node N4 and the anode initialization voltage line VAIL. In other words, the seventh transistor T7 may be electrically connected between the anode electrode of the light emitting element LE and the anode initialization voltage line VAIL.

The seventh transistor T7 may be turned on by the gate control signal GC of the gate control line GCL.

When the seventh transistor T7 is turned-on, the potential of the fourth node N4 may be initialized to the anode initialization voltage VAINT.

As shown in FIG. 6, according to an embodiment, the first to seventh transistors T1 to T7 may be provided as P-type MOSFETs. However, this is merely an example, and some of the first to seventh transistors T1 to T7 may be provided as N-type MOSFETs. For example, the third transistor T3 and the fourth transistor T4 may be provided as N-type MOSFETs.

Figure 7:
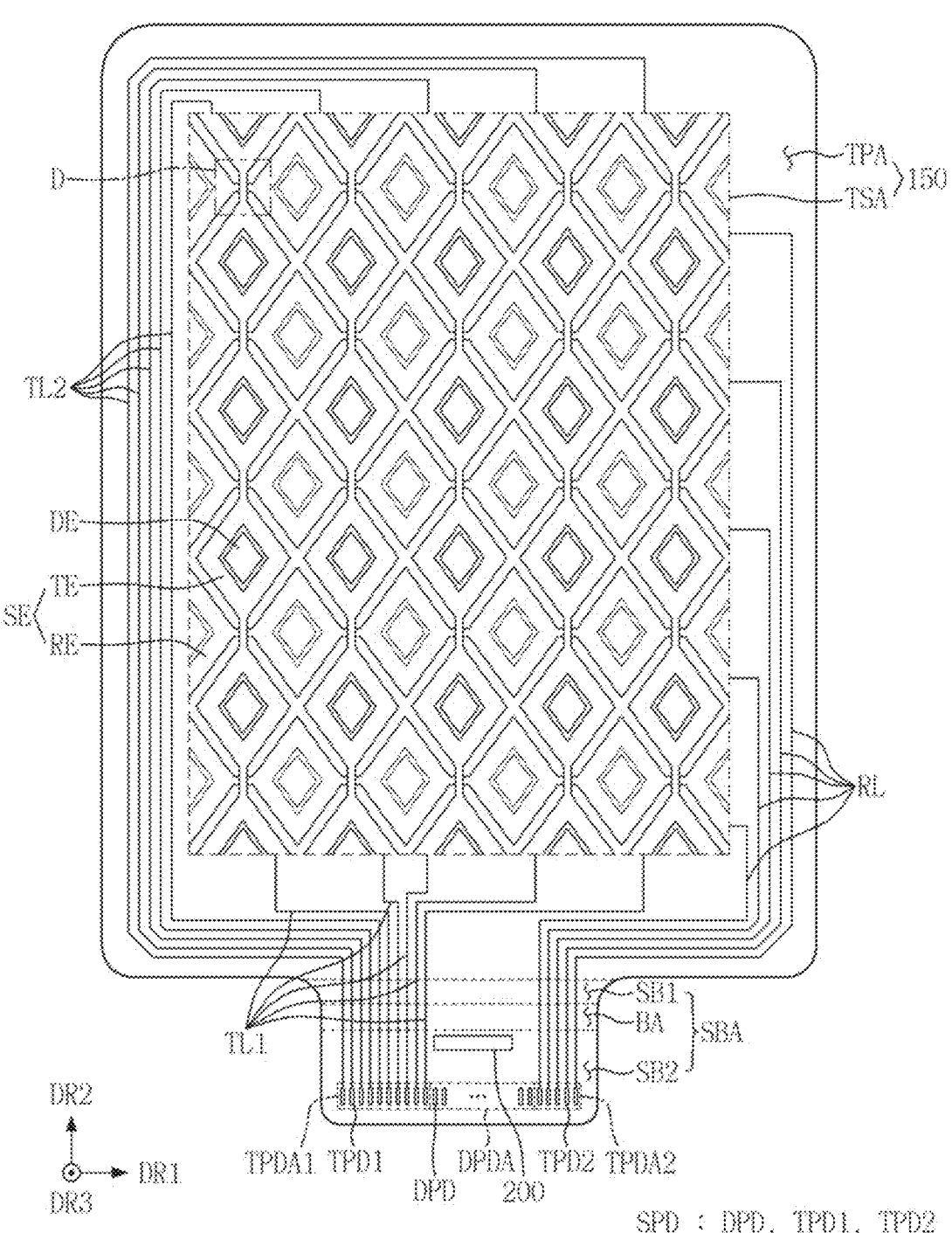
FIG. 7 is a plan view illustrating the touch sensor layer of FIG. 3.
Figure 8:
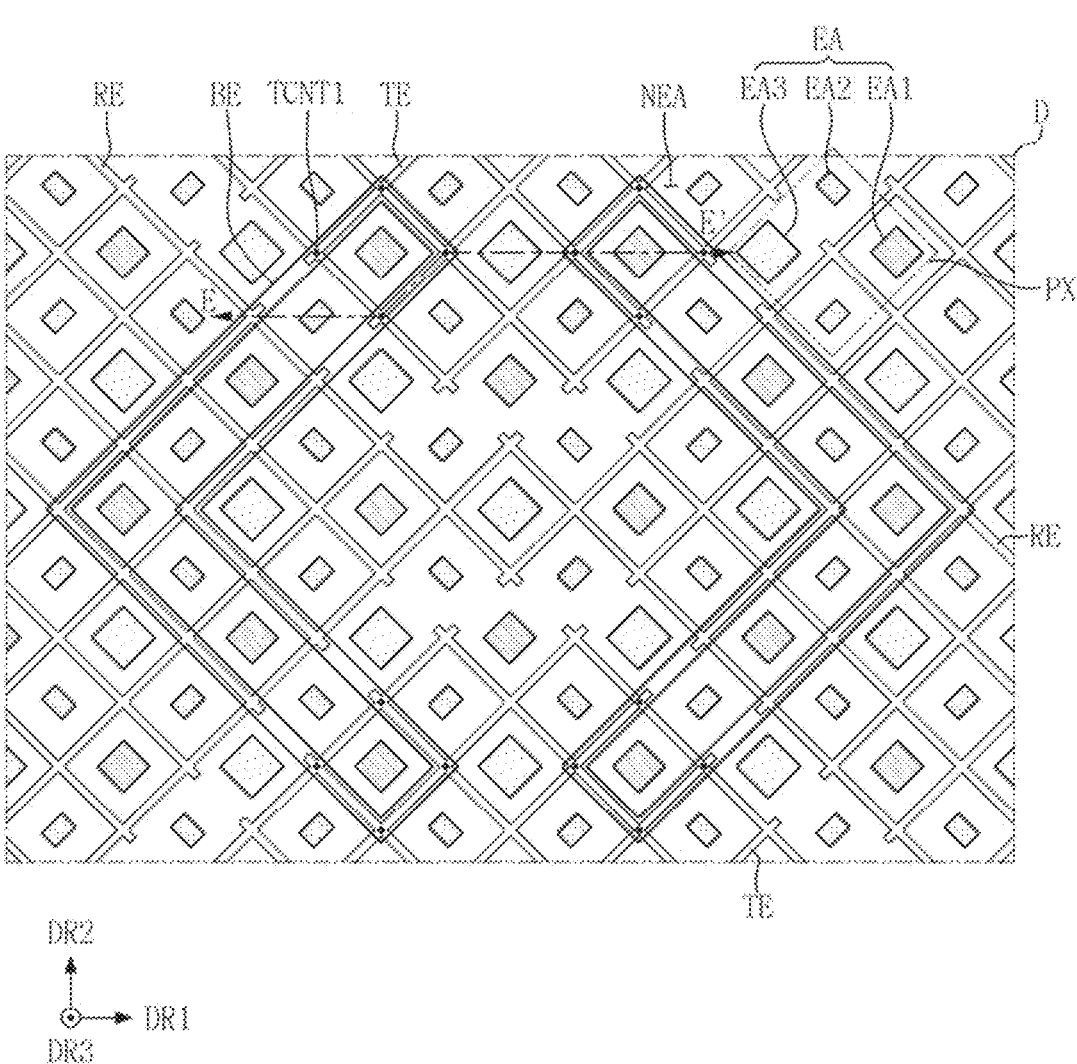
FIG. 8 is an enlarged view showing part D of FIG. 7.
Figure 9:
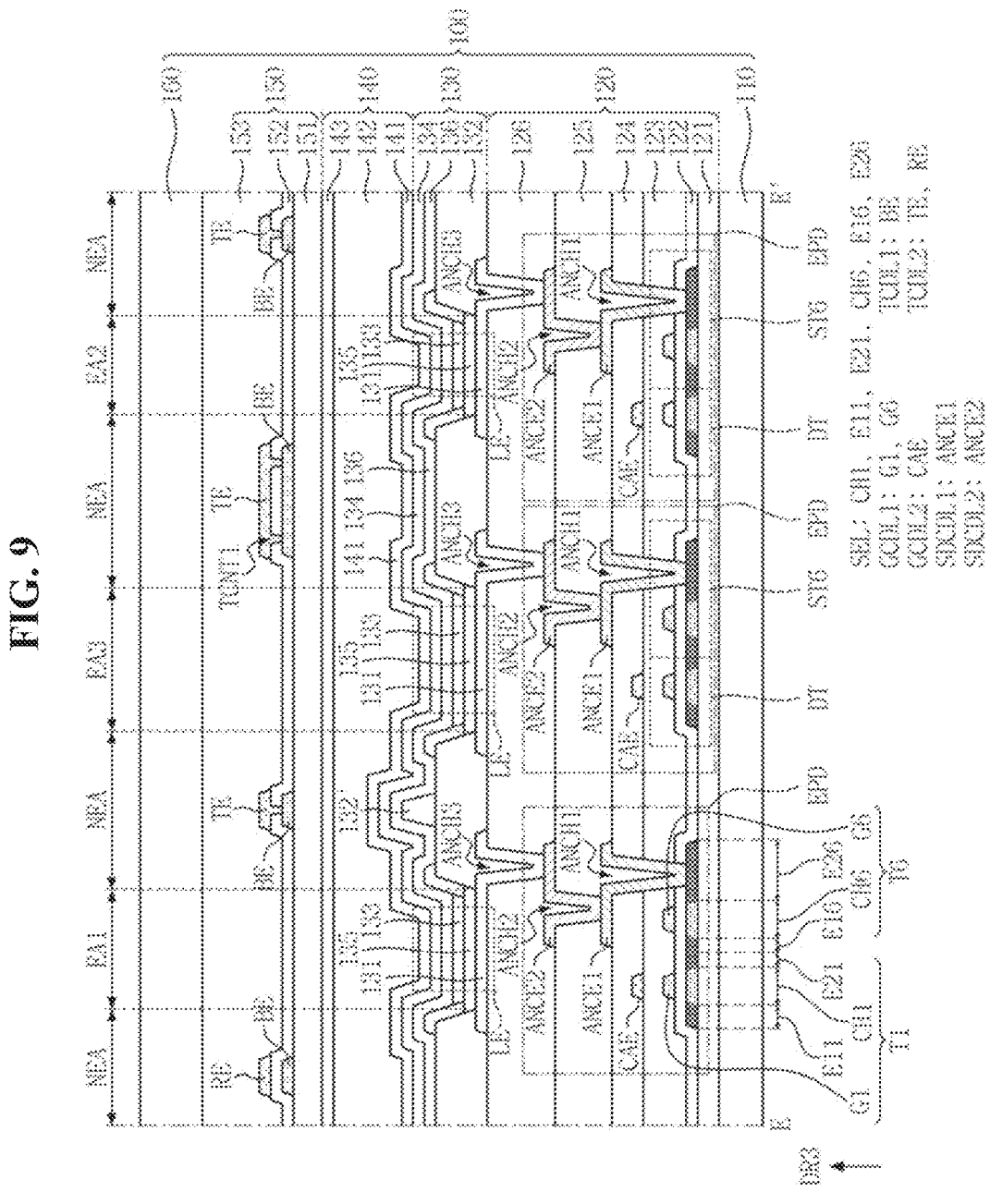
FIG. 9 is a cross-sectional view taken along line E-E' of FIG. 8.

FIG. 7 is a plan view illustrating the touch sensor layer of FIG. 3. FIG. 8 is an enlarged view showing part D of FIG. 7. FIG. 9 is a cross-sectional view taken along line E-E' of FIG. 8.

FIG. 7 illustrates the touch sensor layer 150 that uses a capacitance method. In this case, the touch driving circuit 400 (see FIG. 3) may detect a touch based on fluctuations in capacitance. However, the illustration in FIG. 7 is provided as an example for ease of description, and the touch sensor layer 150 according to embodiments is not limited to the configuration shown in FIG. 7.

FIG. 7 illustrates only a portion of the components of the touch sensor layer 150 for simplicity.

Referring to FIG. 7, the touch sensor layer 150 may be disposed in the main region MA. The touch sensor layer 150 may include a touch sensing area TSA for sensing a user's touch and a touch peripheral area TPA around the touch sensing area TSA.

The touch sensing area TSA is wider than the display area DA and may overlap the display area DA. Accordingly, the touch peripheral area TPA, which is a periphery of the touch sensing area TSA, may be similar to the non-display area NDA, which is a periphery of the display area DA.

For example, the touch sensing area TSA may overlap the display area DA and the edge of the non-display area NDA in contact with the display area DA. In this case, the touch peripheral area TPA may overlap the remaining part of the non-display area NDA that does not correspond to the touch sensing area TSA.

The touch sensor layer 150 may include sensor electrodes SE and dummy electrodes DE arranged in a matrix within the touch sensing area TSA to generate mutual capacitance, as well as sensing transmission lines SENL disposed in the touch peripheral area TPA.

The sensor electrodes SE may include a driving electrode TE (touch driving electrode) to which a driving signal is applied, and a sensing electrode RE (receiving electrode) that detects a voltage charged in mutual capacitance with the driving electrode TE.

The sensing transmission lines SENL may include a first driving line TL1, a second driving line TL2, and a sensing line RL.

Each of the first driving line TL1 and the second driving line TL2 may be electrically connected to two or more driving electrodes TE extending in the second direction DR2 among the driving electrodes TE.

The first driving line TL1 may extend from a first edge of the touch sensing area TSA, located adjacent to the sub-region SBA, to the sub-region SBA.

The second driving line TL2 may extend from a second edge of the touch sensing area TSA that is opposite the first edge, along a third edge of the touch sensing area TSA that is between the first and second edges to the sub-region SBA.

The sensing line RL may be electrically connected to two or more sensing electrodes RE extending in the first direction DR1 among the sensing electrodes RE.

The sensing electrodes RE may be arranged side by side in the first direction DR1. The sensing electrodes RE adjacent in the first direction DR1 may be electrically connected to each other through a protruding portion in the first direction DR1.

The driving electrodes TE may be arranged side by side in the second direction DR2. The driving electrodes TE adjacent in the second direction DR2 may be electrically connected to each other through a bridge electrode BE (see FIG. 8) extending in the second direction DR2.

Each of the driving electrodes TE and the sensing electrodes RE may be shaped to surround the dummy electrode DE positioned at their center.

Each of the dummy electrodes DE may be spaced apart from the driving electrode TE or the sensing electrode RE that surrounds it. The dummy electrode DE may be in a floating state.

FIG. 7 shows a case where each of the driving electrode TE, the sensing electrode RE, and the dummy electrode DE has a rhombus planar shape, but this is only an example. In other words, the planar shape of the driving electrode TE, the sensing electrode RE, and the dummy electrode DE may be a quadrilateral shape other than a rhombus, a polygonal shape other than a quadrilateral shape, a circular shape, or an elliptical shape.

The display panel 100 of the display device 10 according to embodiments may include the signal pads SPD disposed in the second sub-region SB2 of the substrate 110 and connected to the circuit board 300 (see FIG. 3).

The signal pads SPD may include display pads DPD electrically connected to the display driving circuit 200 or the wires of the circuit layer 120 (see FIG. 3), and touch pads TPD1 and TPD2 electrically connected to the sensing transmission lines SENL of the touch sensor layer 150.

For example, the second sub-region SB2 may include a display pad area DPDA adjacent to the display driving circuit 200, and a first touch pad area TPDA1 and a second touch pad area TPDA2 disposed on both sides of the display pad area DPDA.

The display pads DPD may be disposed in the display pad area DPDA.

The first touch pads TPD1 electrically connected to the first driving line TL1 and the second driving line TL2, respectively, may be disposed in the first touch pad area TPDA1.

The second touch pads TPD2 electrically connected to the sensing line RL, respectively, may be disposed in the second touch pad area TPDA2.

Referring to FIG. 8, the touch sensor layer 150 may further include the bridge electrode BE that electrically connects the driving electrodes TE adjacent in the second direction DR2.

The bridge electrode BE may be electrically connected to the driving electrodes TE through touch electrode connection holes TCNT1.

The driving electrodes TE adjacent in the second direction DR2 may be electrically connected to each other through two or more bridge electrodes BE. In this way, reliability of the electrical connection between the driving electrodes TE may be improved.

Although FIG. 8 illustrates that two bridge electrodes BE parallel to each other are disposed between the driving electrodes TE adjacent to each other in the second direction DR2, this is only an example.

Although FIG. 8 illustrates the bridge electrode BE having a shape including one bend, this is only an example.

The driving electrode TE and the sensing electrode RE may be spaced apart from each other.

The bridge electrode BE may be disposed in a different conductive layer from the driving electrode TE and the sensing electrode RE.

The driving electrode TE, the sensing electrode RE, and the bridge electrode BE may have a mesh or net structure in a plan view. The dummy electrodes DE may also have a mesh or net structure in a plan view. In this way, by reducing the overlapping width of the driving electrode TE, the sensing electrode RE, the dummy electrode DE, and the bridge electrode BE in the emission areas EA, the decrease in light emission efficiency of the emission areas EA due to these electrodes may be reduced.

Referring to FIG. 9, the display panel 100 of the display device 10 according to embodiments may include the substrate 110, the circuit layer 120 on the substrate 110, the element layer 130 on the circuit layer 120, the encapsulation layer 140 on the element layer 130, and the touch sensor layer 150 on the encapsulation layer 140.

In addition, the display panel 100 of the display device 10 according to embodiments may further include the polarization layer 160 disposed on the touch sensor layer 150.

The circuit layer 120 may include a semiconductor layer SEL (CH1, E11, E21, CH6, E16, and E26) disposed on the substrate 110, a first gate insulating layer 122 covering the semiconductor layer SEL, a first gate conductive layer GCDL1 (G1 and G6) disposed on the first gate insulating layer 122, a second gate insulating layer 123 covering the first gate conductive layer GCDL1, a second gate conductive layer GCDL2 (CAE) disposed on the second gate insulating layer 123, an interlayer insulating layer 124 covering the second gate conductive layer GCDL2, a first source-drain conductive layer SDCDL1 (ANCE1) disposed on the interlayer insulating layer 124, a first planarization layer 125 covering the first source-drain conductive layer SDCDL1, a second source-drain conductive layer SDCDL2 (ANCE2) disposed on the first planarization layer 125, and a second planarization layer 126 covering the second source-drain conductive layer SDCDL2.

The circuit layer 120 may further include the buffer layer 121 covering the substrate 110.

In this case, the semiconductor layer SEL may be disposed on the buffer layer 121.

The circuit layer 120 may include the light emitting pixel drivers EPD respectively corresponding to the emission areas EA.

Each of the light emitting pixel drivers EPD may include the first transistor T1, the second to seventh transistors T2 to T7 (see FIG. 6) electrically connected to the first transistor T1, and at least one capacitor PC1 (see FIG. 6).

FIG. 9 shows the first transistor T1, the sixth transistor T6, and the light emitting element LE of the light emitting pixel driver EPD of FIG. 6.

The semiconductor layer SEL on the buffer layer 121 may include channel portions CH1 and CH6, first electrode portions E11 and E16, and second electrode portions E21 and E26 of each of the first to seventh transistors T1 to T7 provided as P-type MOSFETs.

In each of the first transistor T1 and the sixth transistor T6, the first electrode portions E11 and E16 may be connected to first ends of the channel portions CH1 and CH6, and the second electrode portions E21 and E26 may be connected to second ends of the channel portions CH1 and CH6.

The second electrode portion E21 of the first transistor T1 may be connected to the first electrode portion E16 of the sixth transistor T6.

The first gate conductive layer GCDL1 on the first gate insulating layer 123 may include the gate electrodes G1 and G6 of each of the first to seventh transistors T1 to T7 provided as P-type MOSFETs.

In the first transistor T1 and the sixth transistor T6, the gate electrodes G1 and G6 may overlap the channel portions CH1 and CH6, respectively.

In the light emitting pixel driver EPD of FIG. 6, the second transistor T2, the first sub-transistor T31, the second sub-transistor T32, the third sub-transistor T41, the fourth sub-transistor T42, the fifth transistor T5 and the seventh transistor T7 are all P-type MOSFETs like the first transistor T1 and the sixth transistor T6. Therefore, redundant descriptions will be omitted.

The second gate conductive layer GCDL2 on the second gate insulating layer 124 may include a capacitor electrode CAE.

The capacitor electrode CAE may overlap the gate electrode G1 of the first transistor T1.

Accordingly, the pixel capacitor PC1 (see FIG. 6) may be provided by the overlapping area between the capacitor electrode CAE and the gate electrode G1 of the first transistor T1.

Each of the buffer layer 121, the first gate insulating layer 122, the second gate insulating layer 123, and the interlayer insulating layer 124 may include an inorganic insulating material.

The first source-drain conductive layer SDCDL1 on the interlayer insulating layer 124 may include a first anode connection electrode ANCE1.

The first anode connection electrode ANCE1 may be electrically connected to the second electrode portion E26 of the sixth transistor T6 through a first anode connection hole ANCH1.

The second source-drain conductive layer SDCDL2 on the first planarization layer 125 may include a second anode connection electrode ANCE2.

The second anode connection electrode ANCE2 may be electrically connected to the first anode connection electrode ANCE1 through a second anode connection hole ANCH2.

An anode electrode 131 of the element layer 130 may be disposed on the second planarization layer 126, and may be electrically connected to the second anode connection electrode ANCE2 through a third anode connection hole ANCH3.

Accordingly, the anode electrode 131 may be electrically connected to the second electrode portion E26 of the sixth transistor T6 through the first anode connection electrode ANCE1 and the second anode connection electrode ANCE2.

The element layer 130 on the circuit layer 120 may include the light emitting elements LE respectively disposed in the emission areas EA1, EA2, and EA3.

Each of the light emitting elements LE may include a structure in which a light emitting layer 133 is disposed between the anode electrode 131 and a cathode electrode 134 facing each other.

In accordance with embodiments, the element layer 130 may include the anode electrodes 131 respectively disposed in the emission areas EA, a pixel defining layer 132 disposed in the non-emission area NEA and covering the edge of the anode electrode 131, a spacer layer 132' disposed on a portion of the pixel defining layer 132, the light emitting layers 133 respectively disposed on the anode electrodes 131, and the cathode electrode 134 disposed on the light emitting layers 133, the pixel defining layer 132, and the spacer layer 132'.

Alternatively, each of the light emitting elements LE may further include first common layers 135 disposed between the anode electrodes 131 and the light emitting layers 133, and a second common layer 136 disposed between the light emitting layers 133 and the cathode electrode 134.

The encapsulation layer 140 may cover the element layer 130.

The encapsulation layer 140 serves to block the permeation of oxygen or moisture into the element layer 130 and to reduce electrical or physical impact to the circuit layer 120 and the element layer 130.

The encapsulation layer 140 may include a first encapsulation layer 141 covering the element layer 130 and containing an inorganic insulating material, a second encapsulation layer 142 disposed on the first encapsulation layer 141, overlapping the element layer 130, and containing an organic insulating material, and a third encapsulation layer 143 disposed on the first encapsulation layer 141, covering the second encapsulation layer 142, and containing an inorganic insulating material.

The touch sensor layer 150 may be disposed on the encapsulation layer 140.

The touch sensor layer 150 may include a touch buffer layer 151 disposed on the encapsulation layer 140, a first touch conductive layer TCDL1 (BE) disposed on the touch buffer layer 151, a touch interlayer insulating layer 152 covering the first touch conductive layer TCDL1, a second touch conductive layer TCDL2 (TE and RE) disposed on the touch interlayer insulating layer 152, and a touch planarization layer 153 covering the second touch conductive layer TCDL2.

The first touch conductive layer TCDL1 on the touch buffer layer 151 may include the bridge electrode BE.

The second touch conductive layer TCDL2 on the touch interlayer insulating layer 152 may include the driving electrode TE and the sensing electrode RE.

The dummy electrode DE, positioned inside each of the driving electrode TE and the sensing electrode RE, as well as the first driving line TL1, the second driving line TL2 connected to the driving electrode TE, and the sensing line RL connected to the sensing electrode RE, may all be located in the second touch conductive layer on the touch interlayer insulating layer 152, similar to the driving electrode TE and the sensing electrode RE.

The driving electrode TE may be electrically connected to the bridge electrode BE through the touch electrode connection hole TCNT1 penetrating the touch interlayer insulating layer 152.

The touch buffer layer 151 may include an inorganic insulating material.

The touch interlayer insulating layer 152 may include an inorganic insulating material or an organic insulating material.

The touch planarization layer 153 may contain an organic insulating material.

The polarization layer 160 may be disposed on the touch sensor layer 150.

Figure 10:
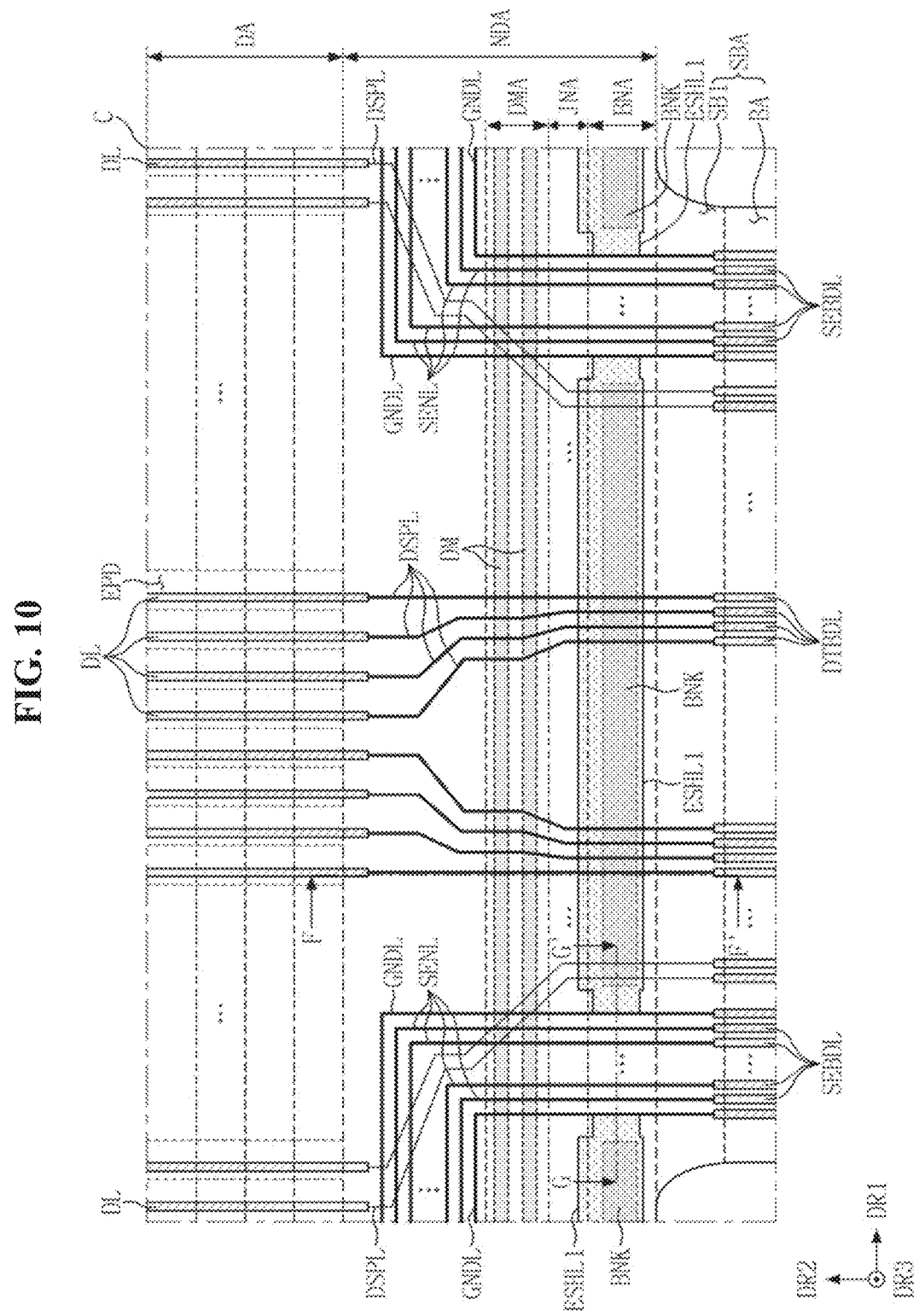
FIG. 10 is a layout diagram showing part C of FIG. 4 according to an embodiment.
Figure 11:
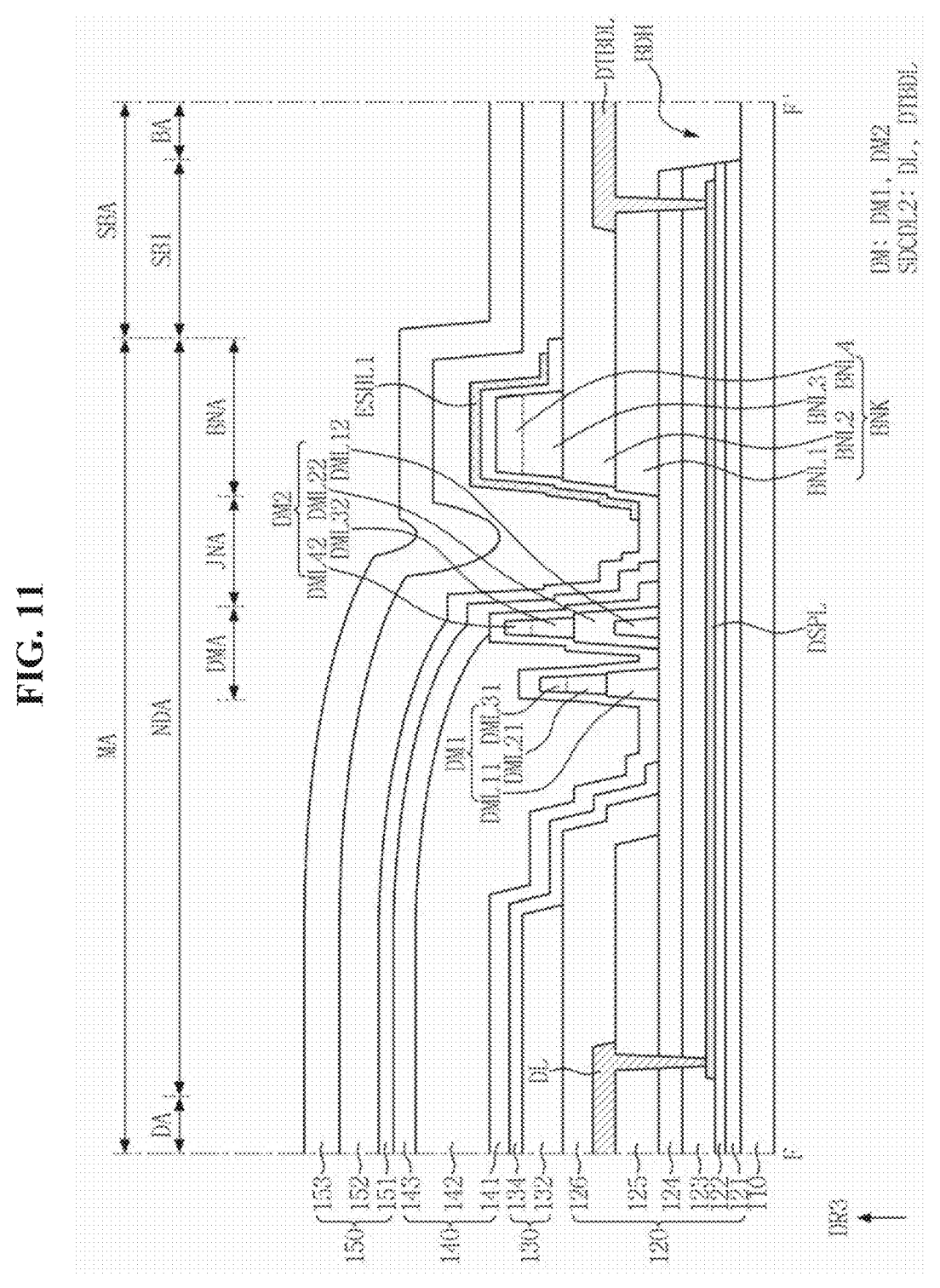
Figure 12:
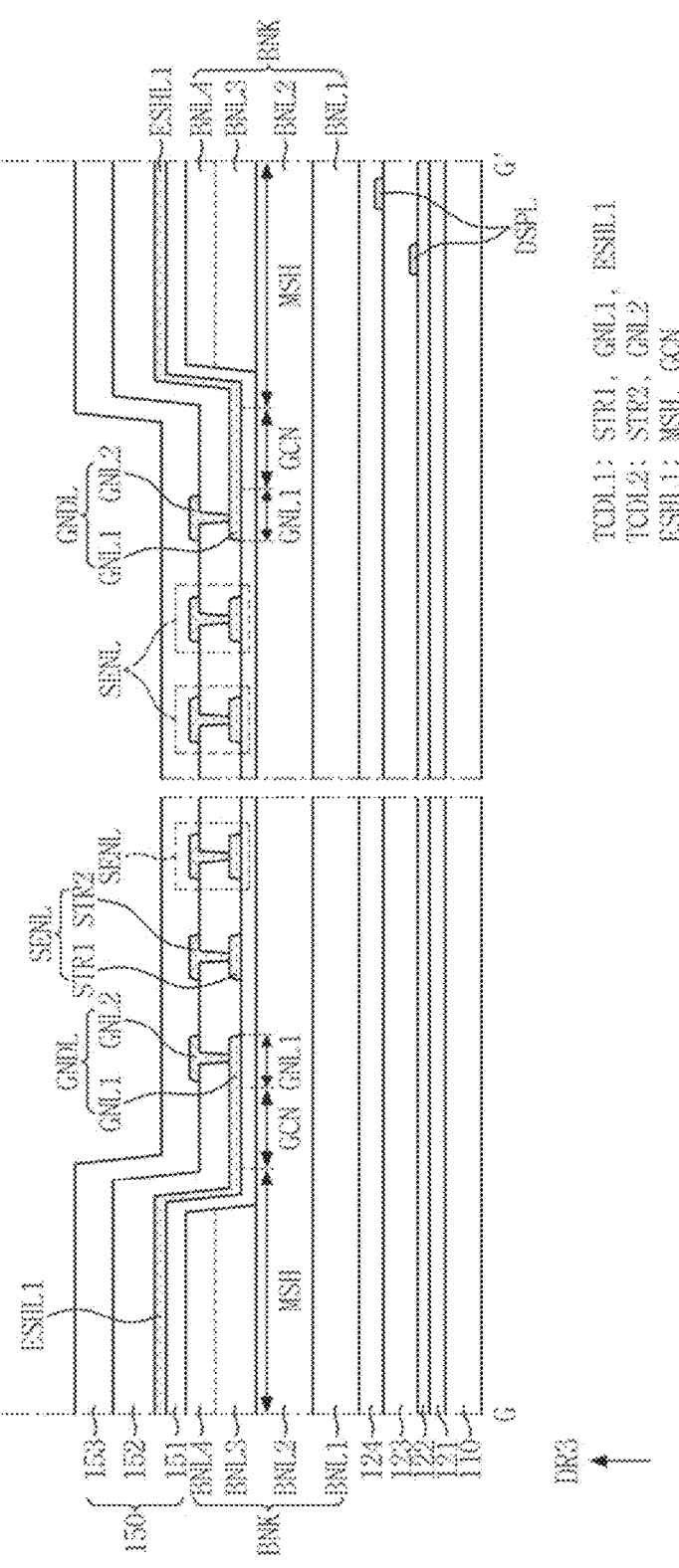
FIG. 12 is a cross-sectional view taken along line G-G' of FIG. 10.

FIG. 10 is a layout diagram showing part C of FIG. 4 according to an embodiment. FIG. 11 is a cross-sectional view taken along line F-F' of FIG. 10. FIG. 12 is a cross-sectional view taken along line G-G' of FIG. 10.

Referring to FIG. 10, the display panel 100 of the display device 10 according to embodiments includes the main region MA (see FIG. 4) including the display area DA and the non-display area NDA, and the sub-region SBA protruding from a first side of the main region MA.

In accordance with embodiments, the non-display area NDA may include the dam area DMA in which at least one dam portion DM surrounding the display area DA is arranged, the bonding area JNA surrounding the dam area DMA, and the bank area BNA disposed between the bonding area JNA and the first side of the main region MA adjacent to the sub-region SBA.

The display panel 100 of the display device 10 according to embodiments may include the sensing transmission lines SENL electrically connected to the touch sensor layer 150 (see FIG. 7) and extending to the sub-region SBA. Adjacent to one of the sensing transmission lines SENL, a ground line GNDL is disposed on one side. For example, for each pair of sensing transmission lines SENL, a ground line GNDL is adjacent to one of these sensing transmission lines SENL. Additionally, a bank BNK disposed in the bank area BNA and adjacent to the ground line GNDL, and a first static electricity shielding portion ESHL1 covers the bank BNK and is electrically connected to the ground line GNDL.

In accordance with embodiments, the element layer 130 (see FIG. 9) of the display panel 100 may include the light emitting elements LE (see FIG. 9) disposed in the emission areas EA1, EA2, and EA3 (see FIG. 9).

In accordance with embodiments, the circuit layer 120 (see FIG. 9) of the display panel 100 may include the light emitting pixel drivers EPD electrically connected to the light emitting elements LE (see FIG. 9), the data lines DL that transmit the data signal Vdata (see FIG. 6) to the light emitting pixel drivers EPD, and data supply lines DSPL respectively electrically connected to the data lines DL, disposed in the non-display area NDA, and extending to the sub-region SBA.

The light emitting pixel drivers EPD may be arranged in a matrix in the first direction DR1 and the second direction DR2 in the display area DA.

The data lines DL may extend in the second direction DR2.

The data supply lines DSPL may be electrically connected between the data lines DL and the display driving circuit 200 (see FIG. 4).

The data supply lines DSPL may overlap a part of the bank BNK.

In other words, the data supply lines DSPL may be arranged in the central portion of the sub-region SBA in the first direction DR1. Consequently, a portion of the bank BNK facing the central portion of the sub-region SBA may overlap the data supply lines DSPL. Further, a portion of the first static electricity shielding portion ESHL1, which covers the bank BNK and faces the central portion of the sub-region SBA, may also overlap the data supply lines DSPL.

The sensing transmission lines SENL may be arranged in a portion of the bank area BNA adjacent to one side of the sub-region SBA along the first direction DR1, intersecting the data lines DL, and may be spaced apart from the bank BNK.

In other words, the sensing transmission lines SENL may be arranged on one side of the sub-region SBA in the first direction DR1, and the data supply lines DSPL may be arranged at the central portion of the sub-region SBA.

Among the sensing transmission lines SENL, the sensing transmission line SENL arranged on one side along the first direction DR1 may be adjacent to the ground line GNDL.

For example, as shown in FIG. 10, the sensing transmission lines SENL may be divided into a first wire group, which is arranged on a first side of the data supply lines DSPL along the first direction, and a second wire group, which is arranged on a second side of the data supply lines DSPL along the first direction DR1.

Two sensing transmission lines SENL arranged on both sides of the first wire group along the first direction DR1 may be adjacent to two ground lines GNDL, respectively.

Similarly, two sensing transmission lines SENL arranged on both sides of the second wire group along the first direction DR1 may be adjacent to two ground lines GNDL, respectively.

The ground line GNDL may transmit a ground power.

The ground line GNDL may be adjacent to the bank BNK in the first direction DR1.

In other words, the ground line GNDL may be disposed between the bank BNK and one of the sensing transmission lines SENL that is disposed on one side.

In accordance with embodiments, the first static electricity shielding portion ESHL1 covering the bank BNK may extend to the ground line GNDL that is adjacent to the bank BNK along the first direction DR1, and may be electrically connected to the ground line GNDL.

In this configuration, even if external static electricity is concentrated at the first static electricity shielding portion ESHL1, it can be discharged to the ground line GNDL, thereby preventing damage to wires caused by static electricity accumulation at the first static electricity shielding portion ESHL1. Consequently, the display quality and lifespan of the display device 10 may be improved.

In accordance with embodiments, the sub-region SBA may include the bending area BA that is transformed into a bent shape, the first sub-region SB1 disposed between one side of the main region MA (see FIG. 4) and one side of the bending area BA, and the second sub-region SB2 (see FIG. 4) extending from the other side of the bending area BA.

In accordance with embodiments, the display panel 100 may further include data bending lines DTBDL disposed in the bending area BA and respectively electrically connected to the data supply lines DSPL, and sensing bending lines SEBDL disposed in the bending area BA and respectively electrically connected to the sensing transmission lines SENL. Each of the data bending lines DTBDL and the sensing bending lines SEBDL may be bent as their names suggest.

Referring to FIG. 11, the circuit layer 120 may include the semiconductor layer SEL (see FIG. 9) disposed on the substrate 110, the first gate insulating layer 122 covering the semiconductor layer SEL (see FIG. 9), the first gate conductive layer GCDL1 (see FIG. 9) disposed on the first gate insulating layer 122, the second gate insulating layer 123 covering the first gate conductive layer GCDL1 (see FIG. 9), the second gate conductive layer GCDL2 (see FIG. 9) disposed on the second gate insulating layer 123, the interlayer insulating layer 124 covering the second gate conductive layer GCDL2 (see FIG. 9), the first planarization layer 125 disposed on the interlayer insulating layer 124, and the second planarization layer 126 disposed on the first planarization layer 125. The circuit layer 120 may further include the buffer layer 121 covering the substrate 110.

The element layer 130 may include the pixel defining layer 132 disposed in the non-emission area of the display area DA, the spacer layer 132' (see FIG. 9) disposed on a part of the pixel defining layer 132, and the cathode electrode 134 disposed in the display area DA.

The pixel defining layer 132 and the cathode electrode 134 may extend to the non-display area NDA.

Each of at least one dam portion DM arranged in the dam area DMA may include two or more dam layers DML11, DML21, DML31, DML12, DML22, DML32, and DML42.

Each of two or more dam layers DML11, DML21, DML31, DML12, DML22, DML32, and DML42 may be disposed on the same layer as one of the first planarization layer 125, the second planarization layer 126, the pixel defining layer 132, and the spacer layer 132' (see FIG. 9).

For example, the at least one dam portion DM may include the first dam portion DM1 surrounding the display area DA and the second dam portion DM2 surrounding the first dam portion DM1.

The first dam portion DM1 may include the first dam layer DML11 disposed on the same layer as the second planarization layer 126, the second dam layer DML21 disposed on the same layer as the pixel defining layer 132, and the third dam layer DML31 disposed on the same layer as the spacer layer 132' (see FIG. 9).

The second dam portion DM2 may include the first dam layer DML12 disposed on the same layer as the first planarization layer 125, the second dam layer DML22 disposed on the same layer as the second planarization layer 126, the third dam layer DML32 disposed on the same layer as the pixel defining layer 132, and the fourth dam layer DML42 disposed on the same layer as the spacer layer 132' (see FIG. 9).

The encapsulation layer 140 may include a first encapsulation layer 141 covering the cathode electrode 134 of the element layer 130 and containing an inorganic insulating material, a second encapsulation layer 142 disposed on the first encapsulation layer 141 and containing an organic insulating material, and a third encapsulation layer 143 covering the second encapsulation layer 142 and containing an inorganic insulating material.

The second encapsulation layer 142 may be formed of an organic insulating material such as acryl resin, epoxy resin, phenolic resin, polyamide resin, polyimide resin and the like.

The second encapsulation layer 142 may be prepared by a process in which an organic material in a liquid state is applied onto the first encapsulation layer 141, diffused to cover the display area DA, and then cured. The diffusion range of the liquid organic material may be restricted by at least one dam portion DM.

In other words, the second encapsulation layer 142 may be disposed in the area surrounded by at least one dam portion DM.

The first encapsulation layer 141 may be in contact with the interlayer insulating layer 124 in the bonding area JNA.

The third encapsulation layer 143 may be in contact with the first encapsulation layer 141 or the interlayer insulating layer 124 in the bonding area JNA.

The touch sensor layer 150 disposed on the encapsulation layer 140 includes the touch buffer layer 151 covering the encapsulation layer 140.

The touch buffer layer 151 may be in contact with the third encapsulation layer 143 or the interlayer insulating layer 124 in the bonding area JNA.

Accordingly, a bonding structure between inorganic materials may be disposed in the bonding area JNA.

As shown in FIG. 10, the data supply lines DSPL intersect the bonding area JNA.

Accordingly, as shown in FIGS. 11 and 12, each of the data supply lines DSPL may be disposed in one of the first gate conductive layer GCDL1 (see FIG. 9) and the second gate conductive layer GCDL2 (see FIG. 9) disposed under the interlayer insulating layer 124. For example, in FIG. 11, the data supply line DSPL may be in direct contact with an upper surface of the first gate insulating layer 122.

As shown in FIG. 11, the data lines DL may be disposed in the second source-drain conductive layer SDCDL2 (see FIG. 9) on the first planarization layer 125. For example, the data line DL in FIG. 11 may penetrate the first planarization layer 125, the interlayer insulating layer 124 and the second gate insulating layer 123 to contact the data supply line DSPL.

Further, the data bending lines DTBDL may be disposed on a first bank layer BNL1. A second bank layer BNL2 may cover the data bending lines DTBDL.

For example, the data bending line DTBDL may be disposed in the same layer as the second source-drain conductive layer SDCDL2 (see FIG. 9).

As shown in FIG. 11, to position the bonding structure between inorganic materials in the bonding area JNA, the bank BNK may be spaced apart from the encapsulation layer 140 within the bonding area JNA.

The bank BNK may be configured as a structure in which two or more bank layers BNL1, BNL2, BNL3, and BNL4 are stacked, resulting in a thickness larger than that of at least one dam portion DM.

For example, the bank BNK may include the first bank layer BNL1 disposed in the same layer as the first planarization layer 125, the second bank layer BNL2 disposed in the same layer as the second planarization layer 126, the third bank layer BNL3 disposed in the same layer as the pixel defining layer 132, and the fourth bank layer BNL4 disposed in the same layer as the spacer layer 132' (see FIG. 9).

In accordance with embodiments, to position the data bending lines DTBDL and the sensing bending lines SEBDL in the bending area BA, the first bank layer BNL1 and the second bank layer BNL2, which are disposed in the same layer as the first planarization layer 125 and the second planarization layer 126, may extend to the sub-region SBA.

As shown in FIGS. 11 and 12, the touch sensor layer 150 may include the touch buffer layer 151 covering the encapsulation layer 140, the first touch conductive layer TCDL1 disposed on the touch buffer layer 151, the touch interlayer insulating layer 152 covering the first touch conductive layer TCDL1, the second touch conductive layer TCDL2 disposed on the touch interlayer insulating layer 152, and the touch planarization layer 153 covering the second touch conductive layer TCDL2.

In accordance with embodiments, each of the sensing transmission lines SENL may include a first sensing transmission layer STR1 disposed in the first touch conductive layer TCDL1, and a second sensing transmission layer STR2 disposed in the second touch conductive layer TCDL2. The first sensing transmission layer STR1 may overlap with the second sensing transmission layer STR2.

In each of the sensing transmission lines SENL, the second sensing transmission layer STR2 may be electrically connected to the first sensing transmission layer STR1 through a hole penetrating the touch interlayer insulating layer 152.

The ground line GNDL may include a first ground layer GNL1 disposed in the first touch conductive layer TCDL1, and a second ground layer GNL2 disposed in the second touch conductive layer TCDL2. The first ground layer GNL1 may overlap with the second ground layer GNL2.

The second ground layer GNL2 may be electrically connected to the first ground layer GNL1 through a hole penetrating the touch interlayer insulating layer 152. In accordance with embodiments, the first static electricity shielding portion ESHL1 covering the bank BNK may be disposed in the first touch conductive layer TCDL1.

The first static electricity shielding portion ESHL1 may include a main shielding portion MSH covering the bank BNK, and a ground connecting portion GCN disposed between the main shielding portion MSH and the ground line GNDL.

The ground connecting portion GCN may extend from the main shielding portion MSH to the first ground layer GNL1 of the ground line GNDL to be in contact with the first ground layer GNL1.

Accordingly, the first static electricity shielding portion ESHL1 may be electrically connected to the ground line GNDL.

As described above, in accordance with embodiments, the first static electricity shielding portion ESHL1 may include not only the main shielding portion MSH that covers the bank BNK but also the ground connecting portion GCN, which is in contact with the ground line GNDL positioned between the sensing transmission lines SENL and the bank BNK and extends from the main shielding portion MSH in the first direction DR1. Consequently, even if static electricity from the outside is concentrated at the first static electricity shielding portion ESHL1, which is a conductive pattern with a relatively large width, it can be discharged through the ground line GNDL electrically connected to the first static electricity shielding portion ESHL1. This helps prevent damage to wires caused by external static electricity, thereby improving the display quality and lifespan of the display device 10.

Figure 13:
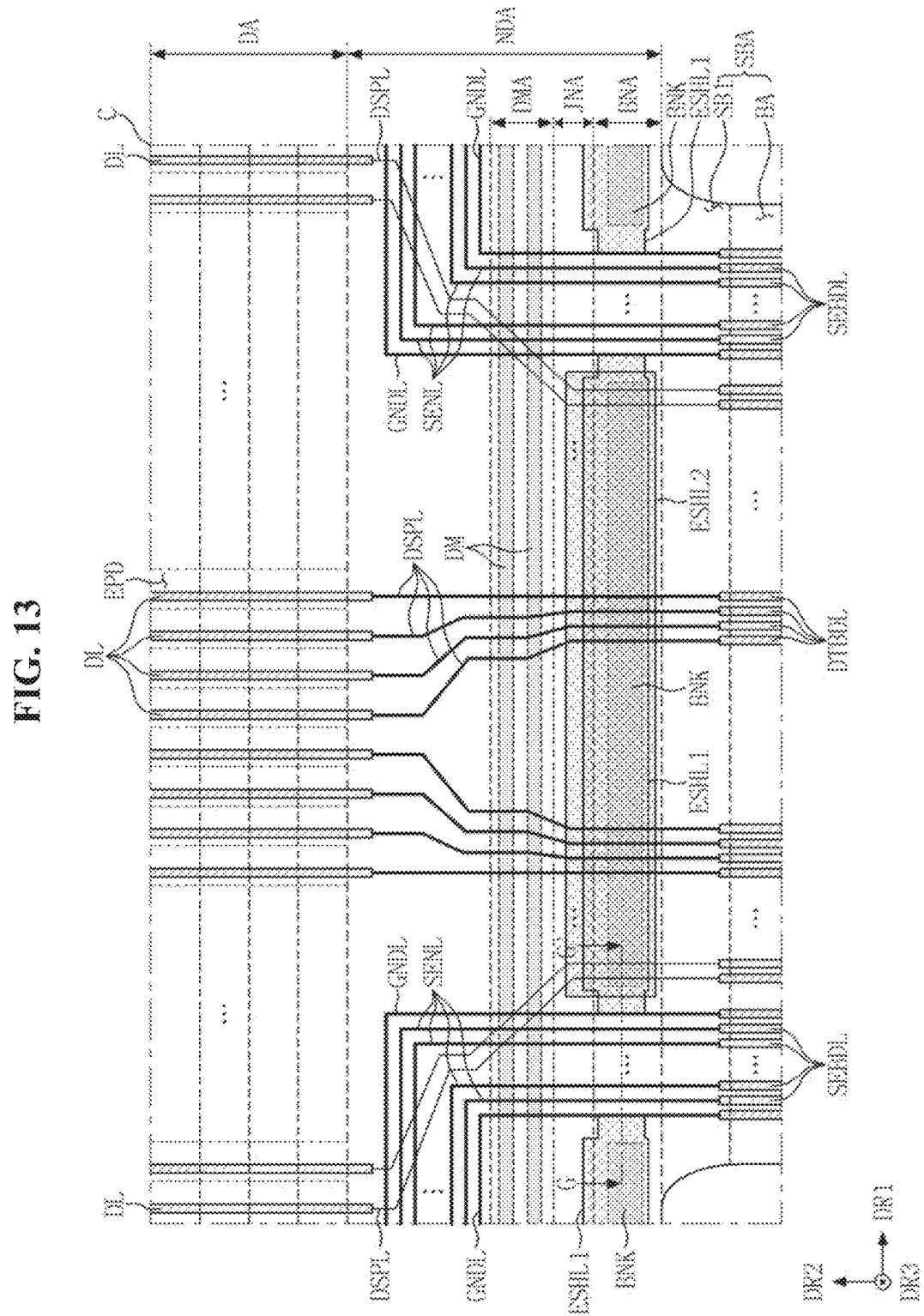
FIG. 13 is a layout diagram showing part C of FIG. 4 according to embodiments.
Figure 14:
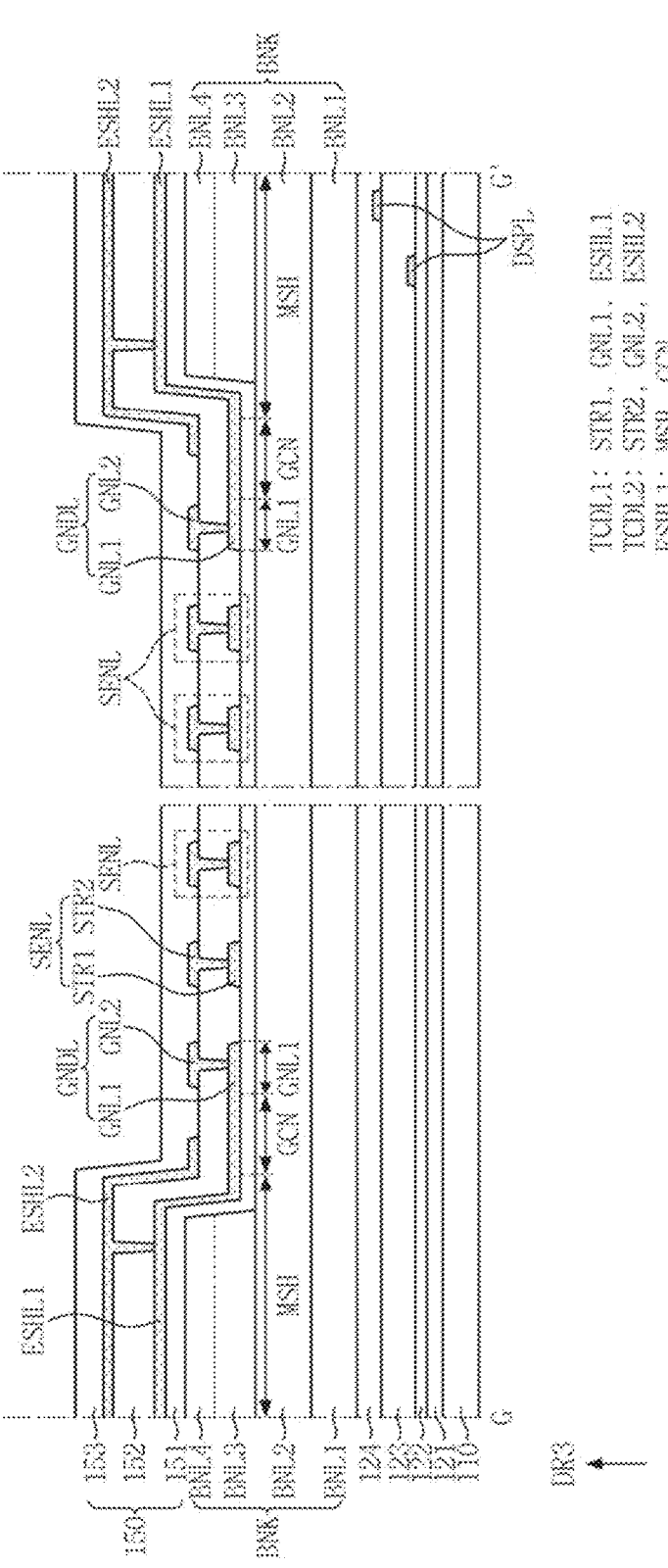
FIGS. 14 and 15 are cross-sectional views taken along line G-G' of FIG. 13 according to embodiments.
Figure 15:
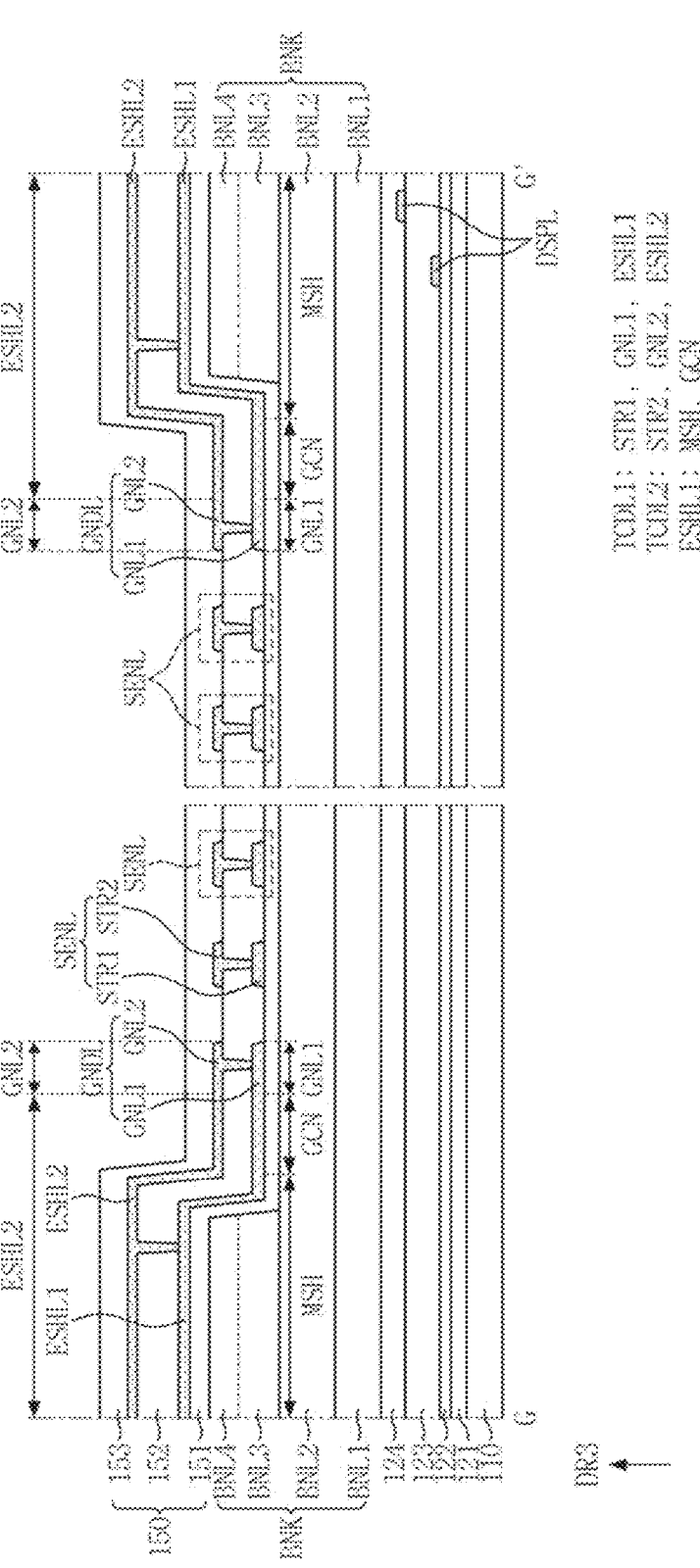

FIG. 13 is a layout diagram showing part C of FIG. 4 according to embodiments. FIGS. 14 and 15 are cross-sectional views taken along line G-G' of FIG. 13 according to embodiments.

The display device 10 according to embodiments shown in FIGS. 13, 14, and 15 is substantially the same as the display device 10 of the embodiments shown in FIGS. 1 to 12 except that the display panel 100 further includes a second static electricity shielding portion ESHL2. Therefore, redundant descriptions will be omitted.

As shown in FIG. 13, the second static electricity shielding portion ESHL2 may be disposed in the bank area BNA and may overlap the data supply lines DSPL.

Specifically, the second static electricity shielding portion ESHL2 may be disposed in a part of the bank area BNA that faces the central portion of the sub-region SBA, and may overlap the data supply lines DSPL.

Furthermore, a part of the first static electricity shielding portion ESHL1 and a part of the bank BNK that face the central portion of the sub-region SBA may overlap the second static electricity shielding portion ESHL2.

Since each of the data supply lines DSPL extends from the sub-region SBA to each of the data lines DL, it may not be straight in one direction but may instead be bent at least once.

Since static electricity tends to concentrate at bent portions of a conductor, the bent portions of each of the data supply lines DSPL may be more susceptible to static electricity.

Therefore, according to the embodiments show in FIG. 13, the second static electricity shielding portion ESHL2 may extend into a part of the bonding area JNA adjacent to the bank area BNA. As a result, the bent portions of the data supply lines DSPL located in parts of the bonding area JNA and the bank area BNK may be covered by the second static electricity shielding portion ESHL2.

In this way, damage to the data supply lines DSPL due to static electricity may be further reduced.

As shown in FIG. 14, the second static electricity shielding portion ESHL2 may be disposed in the second touch conductive layer TCDL2. In this case, the second static electricity shielding portion ESHL2 may overlap the first static electricity shielding portion ESHL1.

The second static electricity shielding portion ESHL2 may be electrically connected to the first static electricity shielding portion ESHL1 through a hole penetrating the touch interlayer insulating layer 152.

The first static electricity shielding portion ESHL1 may include the ground connecting portion GCN in contact with the first ground layer GNL1 and thus may be electrically connected to the ground line GNDL. Accordingly, the second static electricity shielding portion ESHL2 may be electrically connected to the first static electricity shielding portion ESHL1 and the ground line GNDL.

Alternatively, as shown in FIG. 15, the second static electricity shielding portion ESHL2 may extend to the ground line GNDL and may be in contact with the second ground layer GNL2. For example, the second static electricity shielding portion ESHL2 may be in contact with the second ground layer GNL2 through a hole penetrating the touch interlayer insulating layer 152.

As described above, according to embodiments, the data supply lines DSPL in the bank area BNA may be double covered by both the first static electricity shielding portion ESHL1 and the second static electricity shielding portion ESHL2. Since the first static electricity shielding portion ESHL1 and the second static electricity shielding portion ESHL2 are electrically connected to the ground line GNDL, any static electricity concentrated at the first static electricity shielding portion ESHL1 and the second static electricity shielding portion ESHL2 can be easily and quickly discharged through the ground line GNDL. Consequently, the risk of damage to the data supply lines DSPL due to external static electricity is further reduced.

Figure 16:
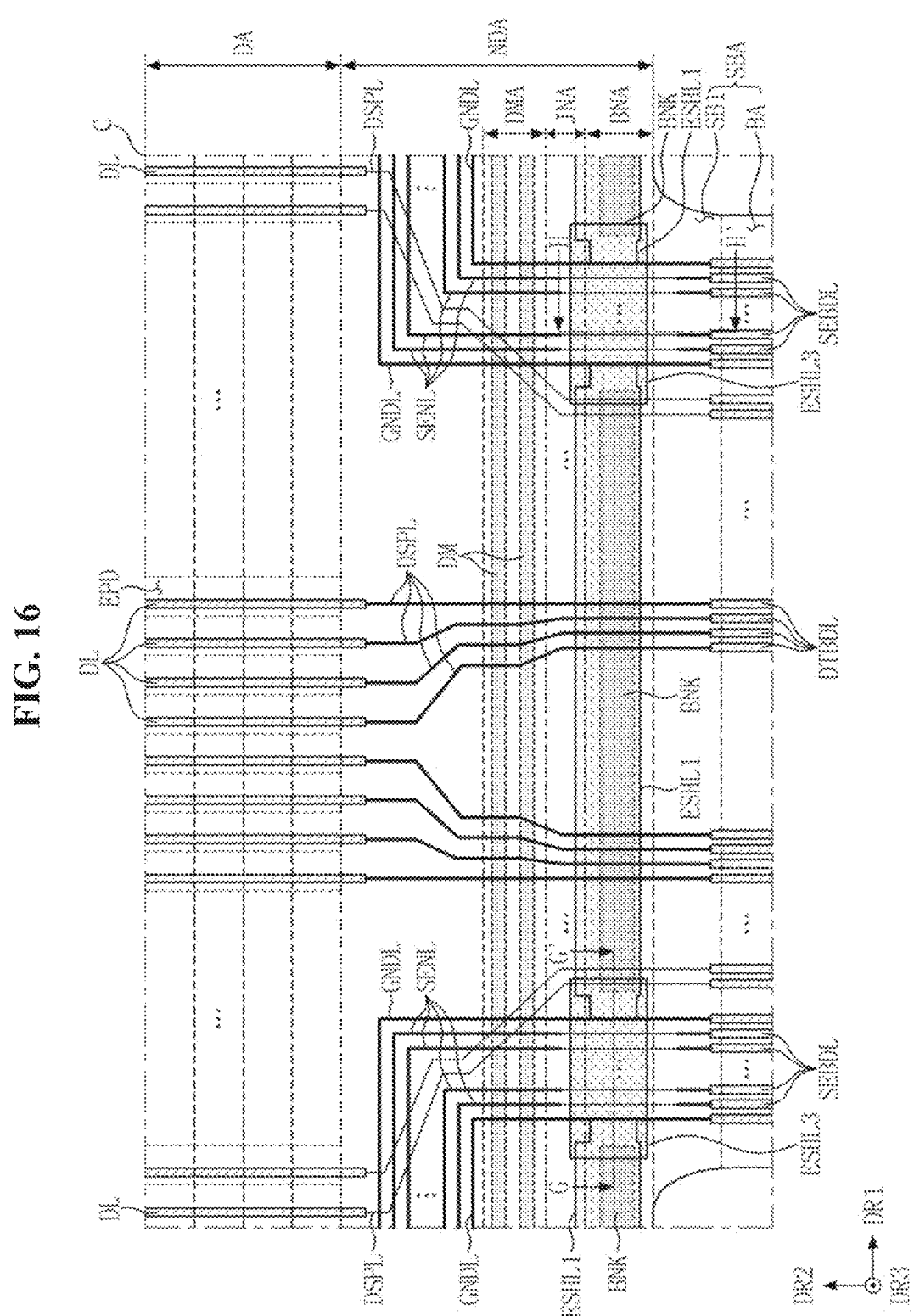
FIG. 16 is a layout diagram showing part C of FIG. 4 according to an embodiment.
Figure 17:
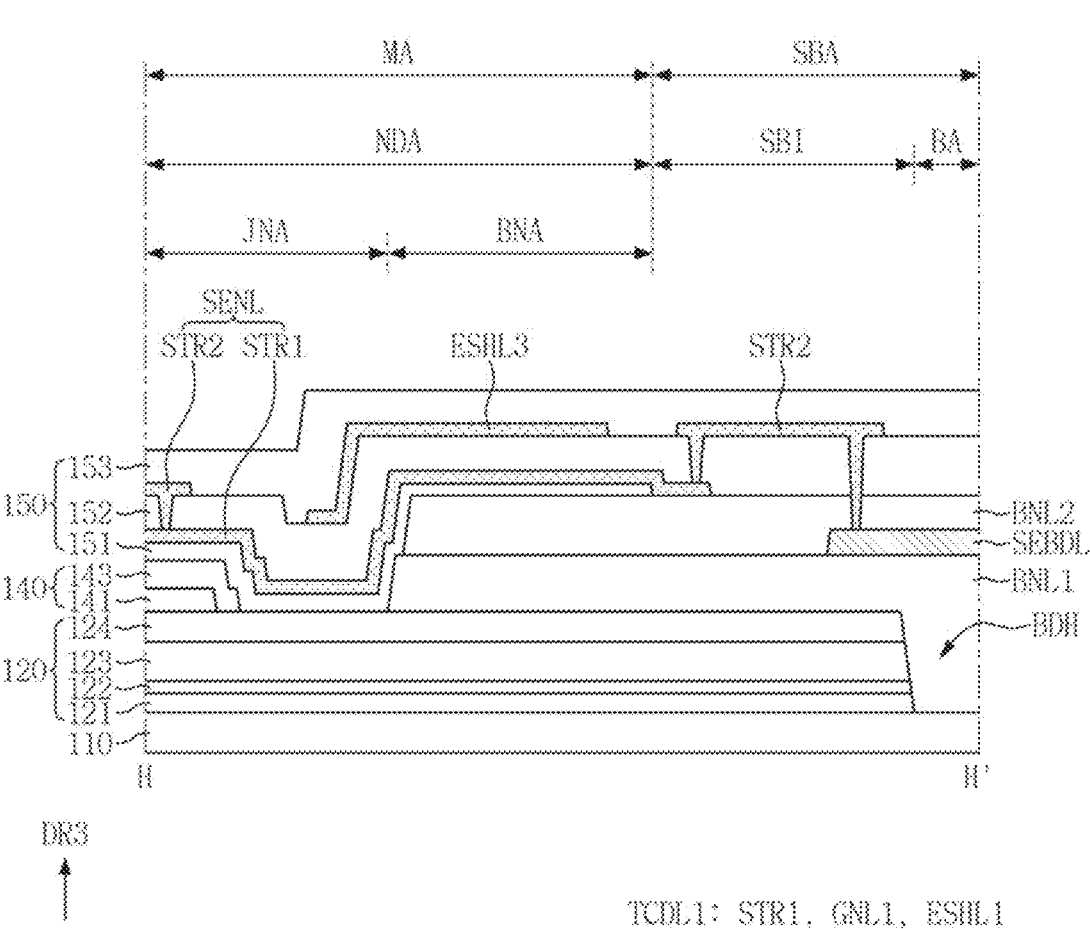
FIG. 17 is a cross-sectional view taken along line H-H' of FIG. 16.
Figure 18:
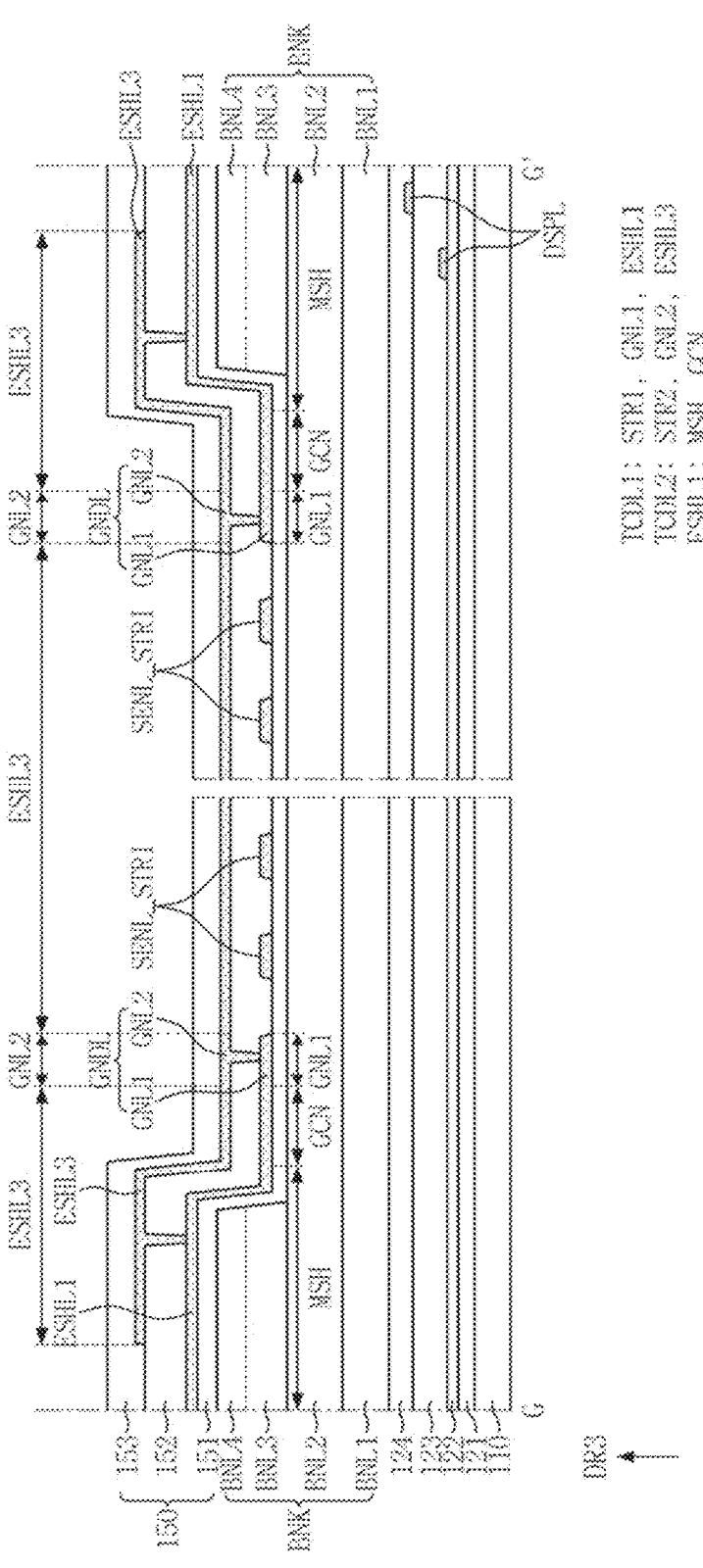
FIG. 18 is a cross-sectional view taken along line G-G' of FIG. 16.

FIG. 16 is a layout diagram showing part C of FIG. 4 according to an embodiment. FIG. 17 is a cross-sectional view taken along line H-H' of FIG. 16. FIG. 18 is a cross-sectional view taken along line G-G' of FIG. 16.

The display device 10 according to the embodiment shown in FIGS. 16, 17, and 18 is substantially the same as the display device 10 of the embodiments shown in FIGS. 1 to 12 except that the display panel 100 further includes a third static electricity shielding portion ESHL3. Therefore, redundant descriptions will be omitted.

As shown in FIG. 16, the third static electricity shielding portion ESHL3 may be disposed in the bank area BNA and may overlap the sensing transmission lines SENL.

The third static electricity shielding portion ESHL3 may further overlap at least one of the data supply lines DSPL disposed at an edge of the bank BNK.

For example, when the sensing transmission lines SENL are divided into the first wire group arranged at a first side of the data supply lines DSPL along the first direction, and the second wire group arranged at a second side of the data supply lines DSPL along the first direction DR1, two third static electricity shielding portions ESHL3 respectively overlapping the first wire group and the second wire group may be provided.

As shown in FIGS. 17 and 18, each of the sensing transmission lines SENL may include a first sensing transmission layer STR1 disposed in the first touch conductive layer TCDL1, and a second sensing transmission layer STR2 disposed in the second touch conductive layer TCDL2.

In accordance with one embodiment, the second sensing transmission layer STR2 of each of the sensing transmission lines SENL may be removed from the bank area BNA.

Specifically, a portion of each of the sensing transmission lines SENL that intersects the bank area BNA may be composed solely of the first sensing transmission layer STR1.

Further, the third static electricity shielding portion ESHL3 may be disposed in the second touch conductive layer TCDL2.

A portion of each of the sensing transmission lines SENL that intersects the bank area BNA may overlap the third static electricity shielding portion ESHL3 disposed in the bank area BNA.

As shown in FIG. 17, the sensing bending lines SEBDL may be disposed on the first bank layer BNL1. The second bank layer BNL2 may cover the sensing bending lines SEBDL.

The sensing bending lines SEBDL may be electrically connected to the first sensing transmission layer STR1 or the second sensing transmission layer STR2 of the sensing transmission lines SENL.

As shown in FIG. 18, the third static electricity shielding portion ESHL3 may be electrically connected to the first static electricity shielding portion ESHL1 through a hole penetrating the touch interlayer insulating layer 152.

Alternatively, the third static electricity shielding portion ESHL3 may be in contact with the second ground layer GNL2.

Accordingly, the third static electricity shielding portion ESHL3 may be electrically connected to the first static electricity shielding portion ESHL1 and the ground line GNDL.

As described above, in accordance with an embodiment, in the bank area BNA, the sensing transmission lines SENL may be covered by the third static electricity shielding portion ESHL31. Since the third static electricity shielding portion ESHL3 is electrically connected to the ground line GNDL, static electricity concentrated at the third static electricity shielding portion ESHL3 may be easily and quickly discharged through the ground line GNDL. Accordingly, damage to the sensing transmission lines SENL due to static electricity introduced from the outside may be reduced.

Figure 19:
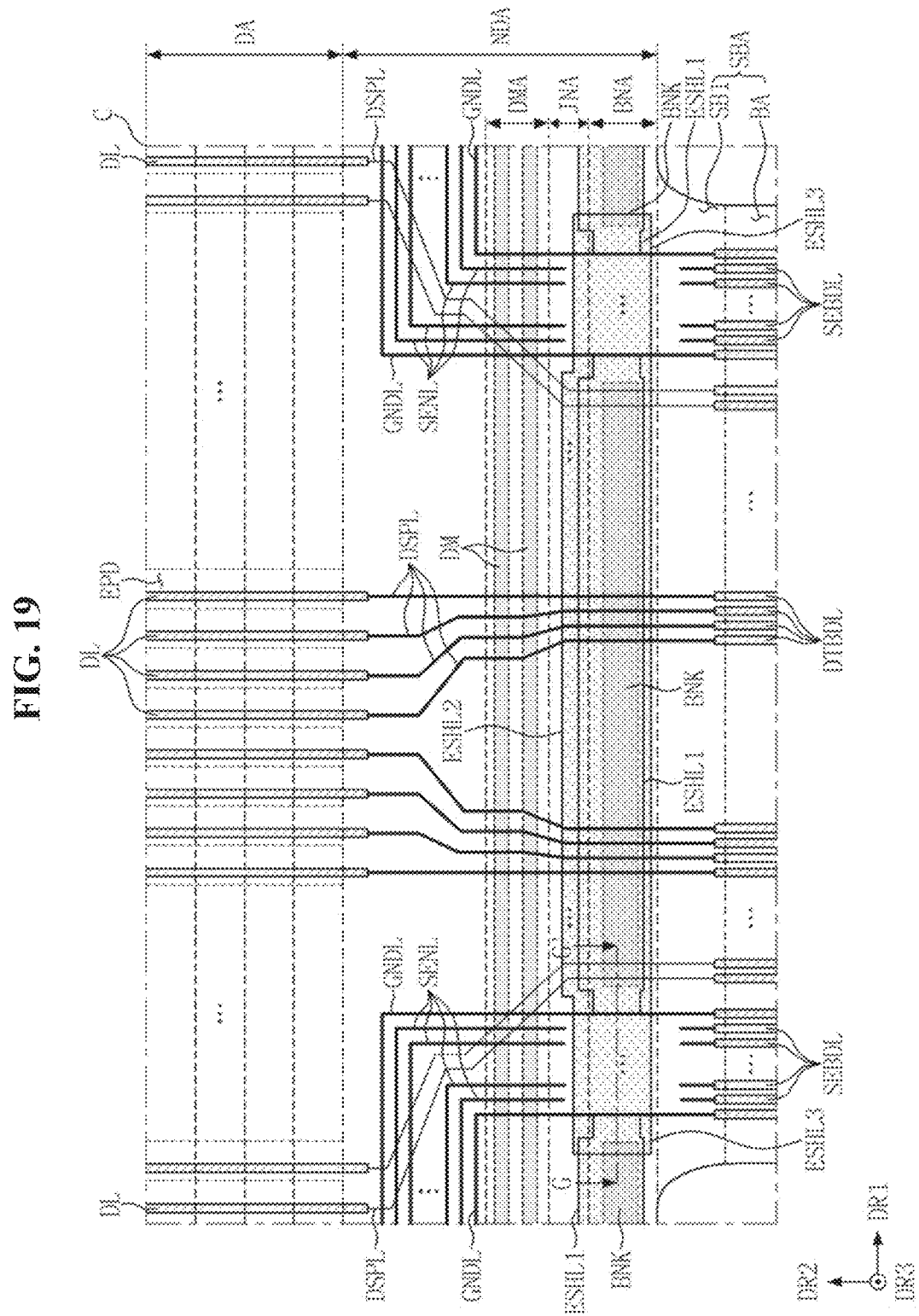
FIG. 19 is a layout diagram showing part C of FIG. 4 according to an embodiment.
Figure 20:
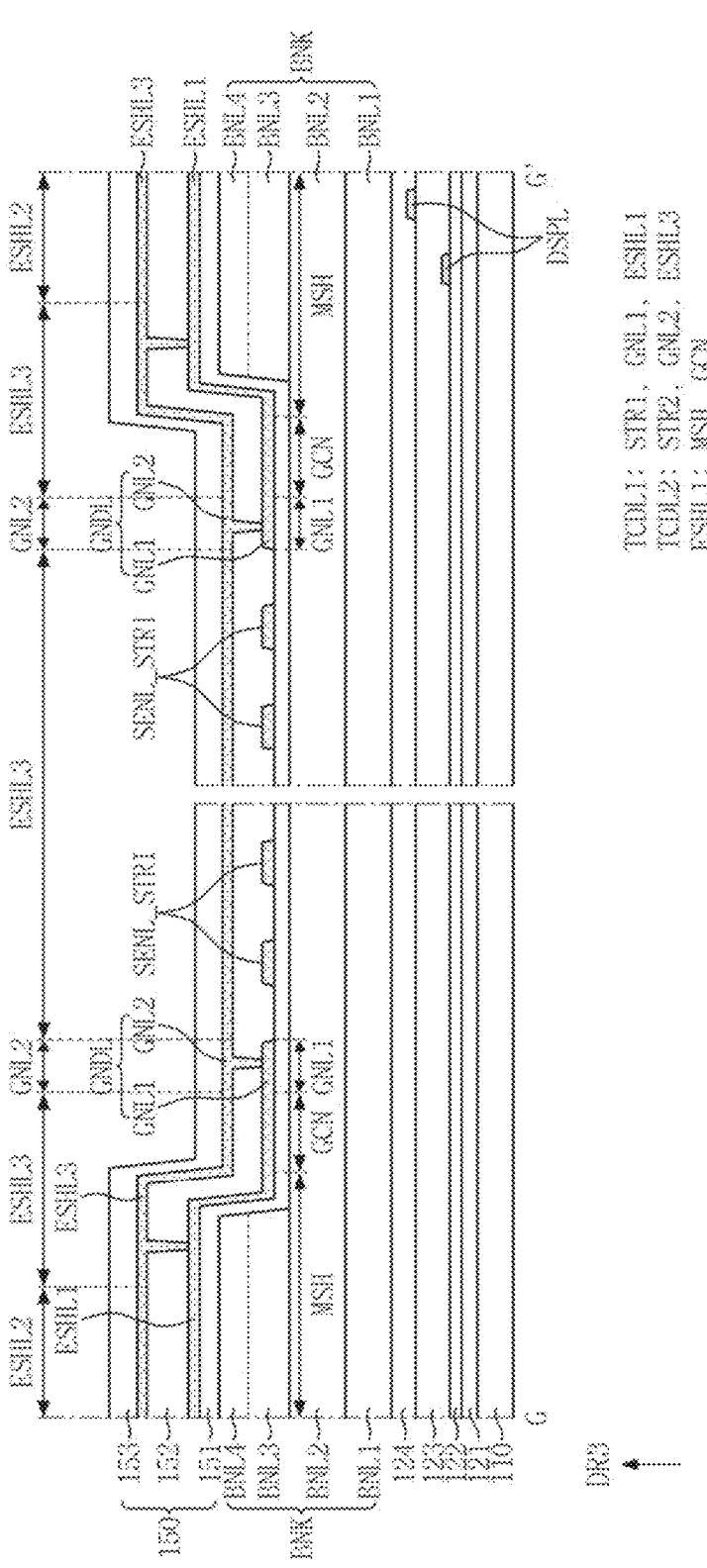
FIG. 20 is a cross-sectional view taken along line G-G' of FIG. 19.

FIG. 19 is a layout diagram showing part C of FIG. 4 according to an embodiment. FIG. 20 is a cross-sectional view taken along line G-G' of FIG. 19.

The display device 10 according to the embodiment shown in FIGS. 19 and 20 is substantially the same as the embodiments shown in FIGS. 10 to 18 except that the display panel 100 includes the second static electricity shielding portion ESHL2 and the third static electricity shielding portion ESHL3. Therefore, redundant descriptions will be omitted.

As described above, the display panel 100 of the display device 10 according to one embodiment includes the first static electricity shielding portion ESHL1, the second static electricity shielding portion ESHL2, and the third static electricity shielding portion ESHL3.

Therefore, damage to the data supply lines DSPL and damage to the sensing transmission lines SENL due to static electricity introduced from the outside may be reduced.

Figure 21:
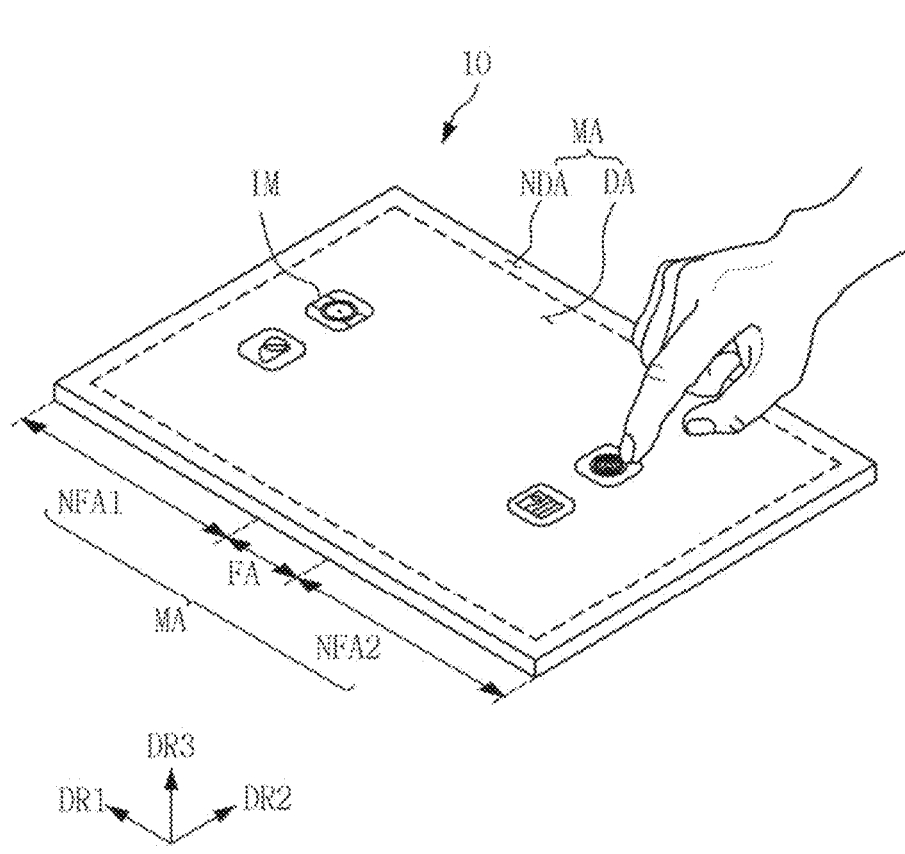
FIGS. 21 and 22 are perspective views showing an unfolded state and a folded state of a display device according to an embodiment.
Figure 22:
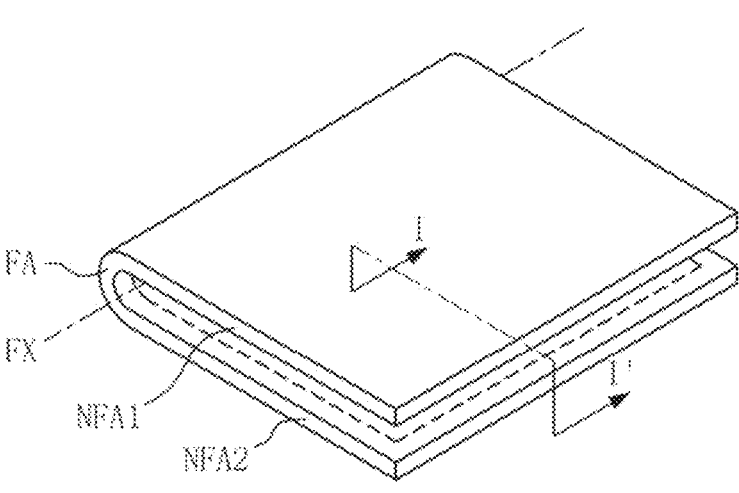
Figure 22:
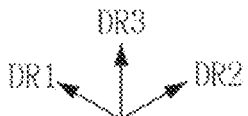
Figure 23:
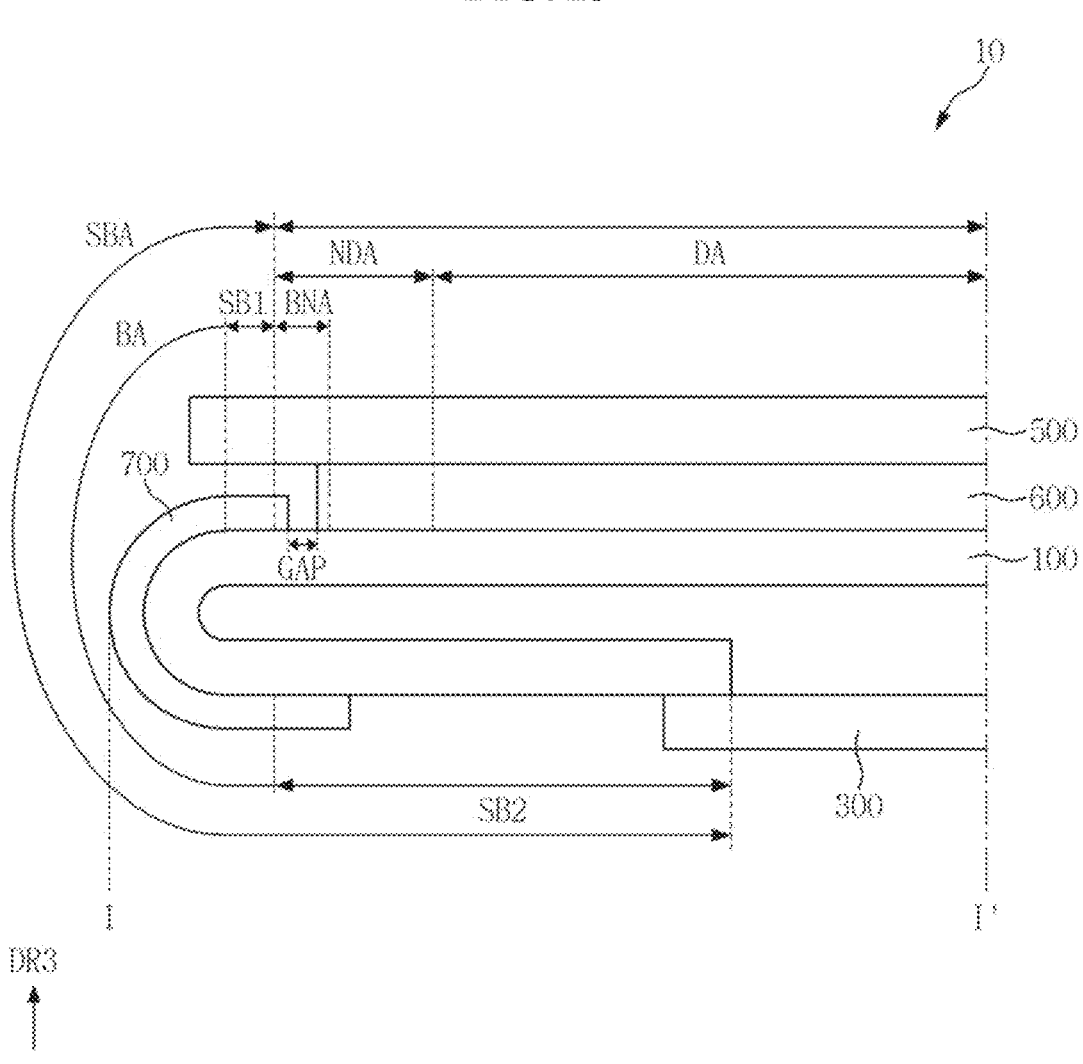
FIG. 23 is a cross-sectional view taken along line I-I' of FIG. 22.

FIGS. 21 and 22 are perspective views showing an unfolded state and a folded state of a display device according to one embodiment. FIG. 23 is a cross-sectional view taken along line I-I' of FIG. 22.

FIG. 21 illustrates an unfolded state of the display device 10 according to an embodiment, and FIG. 22 illustrates a folded state of the display device 10 according to an embodiment.

Referring to FIGS. 21 and 22, one surface of the display device 10 according to an embodiment may include the main region MA including the display area DA and the non-display area NDA.

The display area DA may be an area where images IM are provided.

The non-display area NDA may be a border area surrounding the display area DA.

In accordance with an embodiment, the main region MA may include at least one folding area FA that is bent or unfolded with respect to a folding axis FX (see FIG. 22) extending in one direction, and a plurality of non-folding areas NFA1 and NFA2 disposed on both sides of at least one folding area FA.

For example, when the main region MA includes one folding area FA, the plurality of non-folding areas NFA1 and NFA2 may include the first non-folding area NFA1 in contact with a first side of the folding area FA extending side by side with the folding axis FX, and the second non-folding area NFA2 in contact with a second side of the folding area FA extending side by side with the folding axis FX.

The folding axis FX may extend in one of the first direction DR1 and the second direction DR2.

Referring to FIG. 23, the display device 10 according to an embodiment may further include a cover window 500 facing the main region MA of the display panel 100, an adhesive layer 600 that fixes the cover window 500 on the display panel 100, and a bending cover layer 700 that is spaced apart from the adhesive layer 600 and covers the bending area BA.

Since the display device 10 according to an embodiment can transition between an unfolded state and a folded state, the adhesive layer 600 on the display panel 100 may also transition between a stretched state and a bent state, along with at least one folding area FA.

Furthermore, in the folded state, the adhesive layer 600 bends and shifts away from the folding axis FX, potentially becoming wider compared to its state when unfolded. Therefore, to accommodate the expansion of the adhesive layer 600, the bending cover layer 700 may be spaced apart from the adhesive layer 600.

In accordance with one embodiment, a separation region GAP between the adhesive layer 600 and the bending cover layer 700 may overlap the bank area BNA. In other words, at least a part of the bank area BNA becomes the separation region GAP between the adhesive layer 600 and the bending cover layer 700, so that it may be exposed to the outside without being covered by the adhesive layer 600 or the bending cover layer 700.

However, as described above, the display panel 100 of the display device 10 according to embodiments includes the first static electricity shielding portion ESHL1 electrically connected to the ground line GND and disposed in the bank area BNA, or includes at least one of the second static electricity shielding portion ESHL2 or the third static electricity shielding portion ESHL3.

Therefore, even if the separation region GAP between the adhesive layer 600 and the bending cover layer 700 overlaps the bank area BNA, static electricity is blocked by at least one of the first static electricity shielding portion ESHL1, the second static electricity shielding portion ESHL2, and the third static electricity shielding portion ESHL3 that are disposed in the bank area BNA.

Consequently, even when the display device 10 transitions between an unfolded state and a folded state, the display quality and the lifespan may be improved.

However, the effects of the present disclosure are not limited to those mentioned here. The above and other effects of the present disclosure will become more apparent to those skilled in the art by referencing the claims.

What is claimed is:

1. A display device comprising:

a display panel comprising a main region and a sub-region protruding from a side of the main region, wherein the display panel comprises a circuit layer disposed on a substrate, an element layer disposed on the circuit layer, an encapsulation layer disposed on the element layer, and a touch sensor layer disposed on the encapsulation layer, the main region comprises a display area in which emission areas are arranged, and a non-display area disposed adjacent to the display area, the non-display area comprises a dam area in which at least one dam portion surrounding the display area is arranged, a bonding area surrounding the dam area, and a bank area disposed between the side of the main region and the bonding area, and the display panel further comprises:

sensing transmission lines electrically connected to the touch sensor layer and extending to the sub-region;

a ground line adjacent to one of the sensing transmission lines;

a bank disposed in the bank area and adjacent to the ground line; and a first static electricity shielding portion overlapping the bank and electrically connected to the ground line, the first static electricity shielding portion extending along at least one lateral side surface of the bank and an upper surface of the bank, the first static electricity shielding portion including a ground connecting portion directly contacting the ground line and disposed on a same layer as the ground line.

2. The display device of claim 1, wherein the touch sensor layer comprises:

a touch buffer layer overlapping the encapsulation layer;

a first touch conductive layer disposed on the touch buffer layer;

a touch interlayer insulating layer overlapping the first touch conductive layer;

a second touch conductive layer disposed on the touch interlayer insulating layer; and a touch planarization layer overlapping the second touch conductive layer, the ground line comprises:

a first ground layer disposed in the first touch conductive layer; and a second ground layer disposed in the second touch conductive layer and electrically connected to the first ground layer through a hole penetrating the touch interlayer insulating layer, and the first static electricity shielding portion is disposed in the first touch conductive layer, and comprises a main shielding portion overlapping the bank, and the ground connecting portion extending from the main shielding portion to the first ground layer and in contact with the first ground layer.

3. The display device of claim 2, wherein the element layer comprises light emitting elements disposed in the emission areas, the circuit layer comprises:

light emitting pixel drivers electrically connected to the light emitting elements;

data lines configured to transmit a data signal to the light emitting pixel drivers; and data supply lines respectively electrically connected to the data lines, disposed in the non-display area, and extending to the sub-region, the data supply lines overlap a part of the bank, and the sensing transmission lines are arranged in a portion of the bank area adjacent to a side of the sub-region, intersect the data lines, and are spaced apart from the bank.

4. The display device of claim 3, wherein the circuit layer comprises:

a semiconductor layer disposed on the substrate;

a first gate insulating layer overlapping the semiconductor layer;

a first gate conductive layer disposed on the first gate insulating layer;

a second gate insulating layer overlapping the first gate conductive layer;

a second gate conductive layer disposed on the second gate insulating layer, an interlayer insulating layer overlapping the second gate conductive layer;

a first planarization layer disposed on the interlayer insulating layer; and a second planarization layer disposed on the first planarization layer, wherein the data supply lines are disposed in the first gate conductive layer or the second gate conductive layer.

5. The display device of claim 4, wherein the element layer comprises:

anode electrodes respectively disposed in the emission areas;

a pixel defining layer disposed in a non-emission area disposed between the emission areas and overlapping an edge of each of the anode electrodes;

a spacer layer disposed on a portion of the pixel defining layer;

light emitting layers respectively disposed on the anode electrodes; and a cathode electrode disposed on the pixel defining layer, the spacer layer, and the light emitting layers, wherein the bank comprises:

a first bank layer disposed in the same layer as the first planarization layer;

a second bank layer disposed in the same layer as the second planarization layer;

a third bank layer disposed in the same layer as the pixel defining layer; and a fourth bank layer disposed in the same layer as the spacer layer, and the first bank layer and the second bank layer extend to the sub-region.

6. The display device of claim 5, wherein each of the sensing transmission lines comprises:

a first sensing transmission layer disposed in the first touch conductive layer; and a second sensing transmission layer disposed in the second touch conductive layer and electrically connected to the first sensing transmission layer through a hole penetrating the touch interlayer insulating layer.

7. The display device of claim 6, wherein the display panel further comprises a second static electricity shielding portion disposed in the bank area and overlapping the data supply lines, and the second static electricity shielding portion is disposed in the second touch conductive layer.

8. The display device of claim 7, wherein the second static electricity shielding portion is electrically connected to the first static electricity shielding portion through a hole penetrating the touch interlayer insulating layer.

9. The display device of claim 6, wherein the display panel further comprises a third static electricity shielding portion disposed in the bank area and overlapping the sensing transmission lines, a portion of each of the sensing transmission lines intersecting the bank area is composed solely of the first sensing transmission layer, and the third static electricity shielding portion is disposed in the second touch conductive layer.

10. The display device of claim 9, wherein the third static electricity shielding portion is in contact with the second ground layer, and is electrically connected to the ground line and the first static electricity shielding portion.

11. The display device of claim 6, wherein the at least one dam portion includes two or more dam layers, each of the two or more dam layers is disposed in the same layer as one of the first planarization layer, the second planarization layer, the pixel defining layer, and the spacer layer, the bank has a thickness greater than or equal to that of the at least one dam portion, the encapsulation layer comprises:

a first encapsulation layer overlapping the cathode electrode and containing an inorganic insulating material;

a second encapsulation layer disposed on the first encapsulation layer and containing an organic insulating material; and a third encapsulation layer overlapping the second encapsulation layer and containing the inorganic insulating material, the second encapsulation layer is disposed in an area surrounded by the at least one dam portion, the first encapsulation layer is in contact with the interlayer insulating layer in the bonding area, the third encapsulation layer is in contact with the first encapsulation layer or the interlayer insulating layer in the bonding area, the bank is spaced apart from the encapsulation layer, and the touch buffer layer includes the inorganic insulating material and is in contact with the interlayer insulating layer in a separation region between the bank and the encapsulation layer in the bonding area.

12. The display device of claim 6, wherein the sub-region comprises a bending area which transitions into a bent shape, a first sub-region disposed between the side of the main region and a first side of the bending area, and a second sub-region extending from a second side of the bending area, the display panel further comprises:

a bending hole disposed in the bending area and penetrating the buffer layer, the first gate insulating layer, the second gate insulating layer, and the interlayer insulating layer;

data bending lines disposed in the bending area and respectively electrically connected to the data supply lines; and sensing bending lines disposed in the bending area and respectively electrically connected to the sensing transmission lines, and each of the data bending lines and the sensing bending lines is disposed on the first bank layer.

13. The display device of claim 12, further comprising:

a cover window facing the main region of the display panel;

an adhesive layer configured to fix the cover window on the display panel; and a bending cover layer spaced apart from the adhesive layer and overlapping the bending area, wherein the main region comprises:

at least one folding area which is bent or unfolded with respect to a folding axis extending in one direction; and a plurality of non-folding areas disposed on both sides of the at least one folding area, and a separation region between the adhesive layer and the bending cover layer overlaps the bank area.

14. An electronic device comprising:

a display device comprising:

a display panel comprising a main region and a sub-region protruding from a side of the main region, wherein the display panel comprises a circuit layer disposed on a substrate, an element layer disposed on the circuit layer, an encapsulation layer disposed on the element layer, and a touch sensor layer disposed on the encapsulation layer, the main region comprises a display area in which emission areas are arranged, and a non-display area adjacent to the display area, the non-display area comprises a dam area in which at least one dam portion surrounding the display area is arranged, a bonding area surrounding the dam area, and a bank area disposed between the side of the main region and the bonding area, and the display panel further comprises:

sensing transmission lines electrically connected to the touch sensor layer and extending to the sub-region;

a ground line adjacent to one of the sensing transmission lines;

a bank disposed in the bank area, having a thickness greater than that of the at least one dam portion, and adjacent to the ground line; and a first static electricity shielding portion overlapping the bank and electrically connected to the ground line, and the first static electricity shielding portion comprises a main shielding portion overlapping the bank, and a ground connecting portion disposed between the main shielding portion and the ground line and directly contacting the ground line, the ground connecting portion is disposed on a same layer as the ground line, wherein the main shielding portion extends along at least one lateral side surface of the bank and an upper surface of the bank.

15. The electronic device of claim 14, wherein the touch sensor layer comprises:

a touch buffer layer overlapping the encapsulation layer;

a first touch conductive layer disposed on the touch buffer layer;

a touch interlayer insulating layer overlapping the first touch conductive layer;

a second touch conductive layer disposed on the touch interlayer insulating layer; and a touch planarization layer overlapping the second touch conductive layer, each of the sensing transmission lines comprises:

a first sensing transmission layer disposed in the first touch conductive layer; and a second sensing transmission layer disposed in the second touch conductive layer and electrically connected to the first sensing transmission layer through a hole penetrating the touch interlayer insulating layer, the ground line comprises:

a first ground layer disposed in the first touch conductive layer; and a second ground layer disposed in the second touch conductive layer and electrically connected to the first ground layer through a hole penetrating the touch interlayer insulating layer, the first static electricity shielding portion is disposed in the first touch conductive layer, and the ground connecting portion of the first static electricity shielding portion is in contact with the first ground layer.

16. The electronic device of claim 15, wherein the element layer comprises light emitting elements disposed in the emission areas, the circuit layer comprises:

light emitting pixel drivers electrically connected to the light emitting elements;

data lines configured to transmit a data signal to the light emitting pixel drivers; and data supply lines respectively electrically connected to the data lines, disposed in the non-display area, and extending to the sub-region, the data supply lines overlap a part of the bank, and the sensing transmission lines are arranged in a part of the bank area adjacent to one side of the sub-region, intersect the data lines, and are spaced apart from the bank.

17. The electronic device of claim 16, wherein the display panel further comprises a second static electricity shielding portion disposed in the bank area and overlapping the data supply lines, the second static electricity shielding portion is disposed in the second touch conductive layer, and the second static electricity shielding portion is electrically connected to the ground line and the first static electricity shielding portion through a hole penetrating the touch interlayer insulating layer.

18. The electronic device of claim 16, wherein the display panel further comprises a third static electricity shielding portion disposed in the bank area and overlapping the sensing transmission lines, a portion of each of the sensing transmission lines intersecting the bank area is composed solely of the first sensing transmission layer, and the third static electricity shielding portion is disposed in the second touch conductive layer and is electrically connected to the ground line and the first static electricity shielding portion.

19. The electronic device of claim 16, wherein the circuit layer comprises:

a semiconductor layer disposed on the substrate;

a first gate insulating layer overlapping the semiconductor layer;

a first gate conductive layer disposed on the first gate insulating layer, a second gate insulating layer overlapping the first gate conductive layer;

a second gate conductive layer disposed on the second gate insulating layer;

an interlayer insulating layer overlapping the second gate conductive layer;

a first planarization layer disposed on the interlayer insulating layer; and a second planarization layer disposed on the first planarization layer, the element layer comprises:

anode electrodes respectively disposed in the emission areas;

a pixel defining layer disposed in a non-emission area disposed between the emission areas and overlapping an edge of each of the anode electrodes;

a spacer layer disposed on a portion of the pixel defining layer;

light emitting layers respectively disposed on the anode electrodes; and a cathode electrode disposed on the pixel defining layer, the spacer layer, and the light emitting layers, the encapsulation layer comprises:

a first encapsulation layer overlapping the cathode electrode and containing an inorganic insulating material;

a second encapsulation layer disposed on the first encapsulation layer and containing an organic insulating material; and a third encapsulation layer overlapping the second encapsulation layer and containing the inorganic insulating material, the bank comprises:

a first bank layer disposed in the same layer as the first planarization layer;

a second bank layer disposed in the same layer as the second planarization layer;

a third bank layer disposed in the same layer as the pixel defining layer; and a fourth bank layer disposed in the same layer as the spacer layer, and the first bank layer and the second bank layer extend to the sub-region, the data supply lines are disposed in the first gate conductive layer or the second gate conductive layer, the second encapsulation layer is disposed in an area surrounded by the at least one dam portion, the first encapsulation layer is in contact with the interlayer insulating layer in the bonding area, the third encapsulation layer is in contact with the first encapsulation layer or the interlayer insulating layer in the bonding area, the bank is spaced apart from the encapsulation layer, and the touch buffer layer includes the inorganic insulating material and is in contact with the interlayer insulating layer in a separation region between the bank and the encapsulation layer in the bonding area.

20. The electronic device of claim 16, wherein the sub-region comprises a bending area which transitions into a bent shape, a first sub-region disposed between the side of the main region and a first side of the bending area, and a second sub-region extending from a second side of the bending area, the main region comprises:

at least one folding area which is bent or unfolded with respect to a folding axis extending in one direction; and a plurality of non-folding areas disposed on both sides of the at least one folding area, the display device further comprising:

a cover window facing the main region of the display panel;

an adhesive layer configured to fix the cover window on the display panel; and a bending cover layer spaced apart from the adhesive layer and overlapping the bending area, wherein a separation region between the adhesive layer and the bending cover layer overlaps the bank area.

\* \* \* \* \*